United States Patent
Ryu

(10) Patent No.: US 7,923,320 B2
(45) Date of Patent: Apr. 12, 2011

(54) METHODS OF FABRICATING VERTICAL JFET LIMITED SILICON CARBIDE METAL-OXIDE SEMICONDUCTOR FIELD EFFECT TRANSISTORS

(75) Inventor: Sei-Hyung Ryu, Cary, NC (US)

(73) Assignee: Cree, Inc., Durham, NC (US)

( * ) Notice: Subject to any disclaimer, the term of this patent is extended or adjusted under 35 U.S.C. 154(b) by 361 days.

(21) Appl. No.: 11/677,422

(22) Filed: Feb. 21, 2007

(65) Prior Publication Data
US 2007/0158658 A1  Jul. 12, 2007

Related U.S. Application Data

(62) Division of application No. 10/698,170, filed on Oct. 30, 2003, now Pat. No. 7,221,010.

(60) Provisional application No. 60/435,212, filed on Dec. 20, 2002.

(51) Int. Cl.
*H01L 21/8238* (2006.01)

(52) U.S. Cl. . 438/206; 438/212; 257/302; 257/E31.085; 257/E21.054; 257/E21.065

(58) Field of Classification Search ............ 257/77, 257/329, 330, 409, 350, E21.054, E21.065, 257/302, E31.085; 438/206, 212
See application file for complete search history.

(56) References Cited

U.S. PATENT DOCUMENTS

| | | | |
|---|---|---|---|
| 3,629,011 A | 12/1971 | Tohi et al. | |
| 3,924,024 A | 12/1975 | Naber et al. | 427/95 |
| 4,466,172 A | 8/1984 | Batra | 29/571 |
| 4,811,065 A | 3/1989 | Cogan | |
| 4,875,083 A | 10/1989 | Palmour | 357/23.6 |
| 4,884,113 A | 11/1989 | Muramoto | |
| 5,111,253 A | 5/1992 | Korman et al. | |
| 5,170,231 A | 12/1992 | Fujii et al. | 257/77 |
| 5,170,455 A | 12/1992 | Goossen et al. | 385/89 |
| 5,184,199 A | 2/1993 | Fujii et al. | 29/10 |
| 5,270,554 A | 12/1993 | Palmour | |
| 5,348,895 A | 9/1994 | Smayling et al. | |

(Continued)

FOREIGN PATENT DOCUMENTS

DE  198 09 554  9/1998

(Continued)

OTHER PUBLICATIONS

Vathulya et al. Novel 6H-SiC Power DMOSFET with Implanted P-wel Spacer. IEEEELectron Device Letters, vol. 20, No. 7, Jul. 1999, p. 354-356.*

(Continued)

*Primary Examiner* — Lynne A Gurley
*Assistant Examiner* — Galina Yushina
(74) *Attorney, Agent, or Firm* — Myers Bigel Sibley & Sajovec, P.A.

(57) ABSTRACT

Silicon carbide metal-oxide semiconductor field effect transistors (MOSFETs) may include an n-type silicon carbide drift layer, a first p-type silicon carbide region adjacent the drift layer and having a first n-type silicon carbide region therein, an oxide layer on the drift layer, and an n-type silicon carbide limiting region disposed between the drift layer and a portion of the first p-type region. The limiting region may have a carrier concentration that is greater than the carrier concentration of the drift layer. Methods of fabricating silicon carbide MOSFET devices are also provided.

26 Claims, 14 Drawing Sheets

U.S. PATENT DOCUMENTS

| | | | |
|---|---|---|---|
| 5,384,270 A | 1/1995 | Ueno | |
| 5,385,855 A | 1/1995 | Brown et al. | |
| 5,393,999 A | 2/1995 | Malhi | |
| 5,396,085 A | 3/1995 | Baliga | |
| 5,479,316 A | 12/1995 | Smrtic et al. | 361/322 |
| 5,506,421 A | 4/1996 | Palmour | 257/77 |
| 5,510,281 A | 4/1996 | Ghezzo et al. | |
| 5,510,630 A | 4/1996 | Agarwal et al. | 257/77 |
| 5,587,870 A | 12/1996 | Anderson et al. | 361/313 |
| 5,629,531 A | 5/1997 | Palmour | |
| 5,661,312 A * | 8/1997 | Weitzel et al. | 257/77 |
| 5,710,059 A | 1/1998 | Rottner | |
| 5,726,463 A | 3/1998 | Brown et al. | 257/77 |
| 5,734,180 A | 3/1998 | Malhi | |
| 5,739,564 A | 4/1998 | Kosa et al. | 257/298 |
| 5,763,905 A | 6/1998 | Harris | 257/77 |
| 5,804,483 A | 9/1998 | Harris | |
| 5,814,859 A | 9/1998 | Ghezzo et al. | |
| 5,837,572 A | 11/1998 | Gardner et al. | |
| 5,851,908 A | 12/1998 | Harris et al. | |
| 5,877,041 A | 3/1999 | Fuller | |
| 5,877,045 A | 3/1999 | Kapoor | 438/151 |
| 5,885,870 A | 3/1999 | Maiti et al. | 438/261 |
| 5,917,203 A | 6/1999 | Bhatnagar et al. | |
| 5,939,763 A | 8/1999 | Hao et al. | 257/411 |
| 5,960,289 A | 9/1999 | Tsui et al. | 438/257 |
| 5,972,801 A | 10/1999 | Lipkin et al. | 438/770 |
| 5,976,936 A | 11/1999 | Miyajima et al. | |
| 6,020,600 A | 2/2000 | Miyajima et al. | |
| 6,025,233 A | 2/2000 | Terasawa | |
| 6,025,608 A | 2/2000 | Harris et al. | 257/77 |
| 6,028,012 A | 2/2000 | Wang | |
| 6,048,766 A | 4/2000 | Gardner et al. | |
| 6,054,352 A | 4/2000 | Ueno | 438/268 |
| 6,063,698 A | 5/2000 | Tseng et al. | |
| 6,096,607 A | 8/2000 | Ueno | 438/522 |
| 6,100,169 A | 8/2000 | Suvorov et al. | 438/519 |
| 6,107,142 A | 8/2000 | Suvorov et al. | 438/285 |
| 6,117,735 A | 9/2000 | Ueno | 438/268 |
| 6,133,587 A | 10/2000 | Takeuchi et al. | |
| 6,136,728 A | 10/2000 | Wang | |
| 6,165,822 A | 12/2000 | Okuno et al. | 438/142 |
| 6,180,958 B1 | 1/2001 | Cooper, Jr. | |
| 6,190,973 B1 | 2/2001 | Berg et al. | 438/275 |
| 6,204,135 B1 | 3/2001 | Peters et al. | 438/301 |
| 6,204,203 B1 | 3/2001 | Narwankar et al. | 438/785 |
| 6,211,035 B1 | 4/2001 | Moise et al. | 438/396 |
| 6,221,700 B1 | 4/2001 | Okuno et al. | 438/151 |
| 6,228,720 B1 | 5/2001 | Kitabatake et al. | 438/268 |
| 6,238,967 B1 | 5/2001 | Shiho et al. | 438/244 |
| 6,239,463 B1 | 5/2001 | Williams et al. | 257/328 |
| 6,246,076 B1 | 6/2001 | Lipkin et al. | 257/77 |
| 6,297,100 B1 | 10/2001 | Kumar et al. | |
| 6,297,172 B1 | 10/2001 | Kashiwagi | 438/773 |
| 6,303,508 B1 | 10/2001 | Alok | |
| 6,316,791 B1 | 11/2001 | Schorner et al. | 257/77 |
| 6,344,663 B1 | 2/2002 | Slater, Jr. et al. | 257/77 |
| 6,399,996 B1 | 6/2002 | Chang et al. | |
| 6,420,225 B1 | 7/2002 | Chang et al. | |
| 6,429,041 B1 | 8/2002 | Ryu et al. | 438/105 |
| 6,448,160 B1 | 9/2002 | Chang et al. | |
| 6,455,892 B1 | 9/2002 | Okuno et al. | 57/77 |
| 6,551,865 B2 | 4/2003 | Kumar et al. | |
| 6,570,185 B1 * | 5/2003 | Tan | 257/77 |
| 6,573,534 B1 | 6/2003 | Kumar et al. | |
| 6,593,620 B1 | 7/2003 | Hshieh et al. | 257/335 |
| 6,610,366 B2 | 8/2003 | Lipkin | 427/378 |
| 6,620,697 B1 | 9/2003 | Alok et al. | |
| 6,653,659 B2 | 11/2003 | Ryu et al. | |
| 6,700,156 B2 | 3/2004 | Saitoh et al. | |
| 6,759,684 B2 | 7/2004 | Fukuda et al. | |
| 2001/0055852 A1 | 12/2001 | Moise et al. | 438/396 |
| 2002/0030191 A1 | 3/2002 | Das et al. | 257/77 |
| 2002/0038891 A1* | 4/2002 | Ryu et al. | 257/350 |
| 2002/0047125 A1 | 4/2002 | Fukuda et al. | |
| 2002/0072247 A1 | 6/2002 | Lipkin et al. | 438/767 |
| 2002/0102358 A1 | 8/2002 | Das et al. | 472/376.2 |
| 2002/0149022 A1 | 10/2002 | Ryu et al. | |
| 2003/0209741 A1 | 11/2003 | Saitoh et al. | |
| 2004/0211980 A1 | 10/2004 | Ryu | |
| 2004/0212011 A1 | 10/2004 | Ryu | |

FOREIGN PATENT DOCUMENTS

| | | |
|---|---|---|
| DE | 19809554 A1 | 9/1998 |
| DE | 198 32 329 | 2/1999 |
| DE | 19900171 | 12/2000 |
| DE | 10036208 | 2/2002 |
| EP | 0637069 A1 | 2/1995 |
| EP | 0637069 B1 | 2/1995 |
| EP | 1058317 A2 | 12/2000 |
| EP | 1 204 145 A2 | 5/2002 |
| JP | 62-115873 | 5/1987 |
| JP | 63-299279 | 12/1988 |
| JP | 01117363 | 5/1989 |
| JP | 02-037777 | 2/1990 |
| JP | 03-034466 | 2/1991 |
| JP | 03034466 | 2/1991 |
| JP | 03157974 | 7/1991 |
| JP | 03-205832 | 9/1991 |
| JP | 05-029628 | 2/1993 |
| JP | 08264766 | 10/1996 |
| JP | 09205202 | 8/1997 |
| JP | 11191559 | 7/1999 |
| JP | 11238742 | 8/1999 |
| JP | 11261061 | 9/1999 |
| JP | 11266017 | 9/1999 |
| JP | 11274487 | 10/1999 |
| JP | 2000049167 | 2/2000 |
| JP | 2000082812 | 3/2000 |
| JP | 0200025246 | 9/2000 |
| JP | 2001-119025 | 4/2001 |
| JP | 2000106371 | 4/2001 |
| JP | 2002-299620 | 10/2002 |
| WO | WO 97/08754 | 3/1997 |
| WO | WO 97/17730 | 5/1997 |
| WO | WO 97/39485 | 10/1997 |
| WO | WO 98/02916 | 1/1998 |
| WO | WO 98/02924 | 1/1998 |
| WO | WO99/63591 | 12/1999 |
| WO | WO 00/13236 | 3/2000 |
| WO | WO 01/78134 | 10/2001 |

OTHER PUBLICATIONS

Vathulya et al. A Novel 6-H-SiC Power DMOSFET with Implanted P-Well Spacer. IEEE Electron Device Letters, vol. 20, No. 7, Jul. 1999, pp. 354-356.*

Vathulya. a Novel 6H-SiC Power DMOSFET with Implanted P-Well Spacer. IEEE Electron Device Letter, vol. 20, No. 7, 1999, pp. 354-356.*

Chinese Office Action corresponding to Chinese Patent Application No. 200380106833.6 dated Dec. 21, 2007.

Communication Pursuant to Article 94(3) EPC (8 pages) corresponding to European Application No. 03799873.9; Dated May 20, 2009.

A.K. Agarwal, J.B. Casady, L.B. Rowland, W.F. Valek, and C.D. Brandt, "1400 V 4H-SiC Power MOSFET's," Materials Science Forum vols. 264-268, pp. 989-992, 1998.

A.K. Agarwal, J.B. Casady, L.B. Rowland, W.F. Valek, M.H. White, and C.D. Brandt, "1.1 kV 4H-SiC Power UMOSFET's," *IEEE Electron Device Letters*, vol. 18, No. 12, pp. 586-588, Dec. 1997.

A.K. Agarwal, N.S. Saks, S.S. Mani, V.S. Hegde and P.A. Sanger, "Investigation of Lateral RESURF, 6H-SiC MOSFETs," *Materials Science Forum*, vols. 338-342, pp. 1307-1310, 2000.

A.K. Agarwal, S. Seshadri, and L.B. Rowland, "Temperature Dependence of Fowler-Nordheim Current in 6H-and 4H-SiC MOS Capacitors," *IEEE Electron Device Letters*, vol. 18, No. 12, Dec. 1997, pp. 592-594.

A.V. Suvorov, L.A. Lipkin, G.M. Johnson, R. Singh and J.W. Palmour, "4H-SiC Self-Aligned Implant-Diffused Structure for Power DMOSFETs," *Materials Science Forum* vols. 338-342, pp. 1275-1278, 2000.

Agarwal et al. "A Critical Look at the Performance Advantages and Limitations of 4H-SiC Power UMOSFET Structures," *1996 IEEE ISPSD and IC's Proc.*, May 20-23, 1996, pp. 119-122.

Chakraborty et al. "Interface Properties of N₂O-annealed SiO₂/SiC system," *Proceedings IEEE Hong Kong Electron Devices Meeting*. Jun. 24, 2000, pp. 108-111.

Chang et al. "Observation of a Non-stoichiometric Layer at the Silicon Dioxide—Silicon Carbide Interface: Effect of Oxidation Temperature and Post-Oxidation Processing Conditions," *Mat. Res. Soc. Symp. Proc.* vol. 640, 2001.

Cho et al. "Improvement of charge trapping by hydrogen post-oxidation annealing in gate oxide of 4H-SiC methel-oxide-semiconductor capacitors," *Applied Physics Letters*. vol. 77, No. 8, pp. 1215-1217.

Chung et al., "The Effect of Si:C Source Ratio on SiO₂/SiC Interface State Density for Nitrogen Doped 4H and 6H-SiC," *Materials Science Forum*. (2000) vols. 338-342, pp. 1097-1100.

International Search Report for PCT/US01/30715.

International Search Report for PCT/US02/11691 dated Dec. 4, 2002.

International Search Report for PCT/US01/42414, dated Apr. 21, 2002.

D. Alok, E. Arnold, and R. Egloff, "Process Dependence of Inversion Layer Mobility in 4H-SiC Devices," *Materials Science Forum*, vols. 338-342, pp. 1077-1080, 2000.

Das, Mrinal K. Graduate thesis entitled, *Fundamental Studies of the Silicon Carbide MOS Structure*. Purdue University, 1999.

Fukuda et al. "Improvement of SiO₂/4H-SiC Interface Using High-Temperature Hydrogen Annealing at Low Pressure and Vacuum Annealing," *Jpn J. Appl. Phys*. vol. 38, Apr. 1999, pp. 2306-2309.

Fukuda et al. "Improvement of SiO₂/4H-SiC Interface by Using High Temperature Hydrogen Annealing at 1000° C.," *Extended Abstracts of the International Conference on Solid State Devices and Materials*. Japan Society of Applied Physics, Tokyo, Japan, Sep. 1998.

G.Y. Chung, C.C. Tin, J.R. Williams, K. McDonald, M. Di Ventra, S.T. Pantelides, L.C. Feldman, and R.A. Weller, "Effect of nitric oxide annealing on the interface trap densities near the band edges in the 4H polytype of silicon carbide," *Applied Physics Letters*, vol. 76, No. 13, pp. 1713-1715, Mar. 2000.

G.Y. Chung, C.C. Tin, J.R. Williams, K. McDonald, R.K. Chanana, R.A. Weller, S.T. Pantelides, L.C. Feldman, O.W. Holland, M.K. Das, and J.W. Palmour, "Improved Inversion Channel Mobility for 4H-SiC MOSETs Following High Temperature Anneals in Nitric Oxide," *IEEE Electron Device Letters*, vol. 22, No. 4, Apr. 2001.

H.F. Li, S. Dimitrijev, H.B. Harrison, D. Sweatman, P.T. Tanner. "Improving SiO₂ Grown on P-Type 4H-SiC by NO Annealing," *Materials Science Forum*. vols. 264-268 (1998) pp. 869-872.

J. Tan, J.A. Cooper, Jr., and Mr. R. Melloch, "High-Voltage Accumulation-Layer UMOSFETs in 4H-SiC," *IEEE Electron Device Letters*, vol. 19, No. 12, pp. 487-489, Dec. 1998.

J.B. Casady, A.K. Agarwal, L.B. Rowland, W.F. Valek, and C.D. Brandt, "900 V DMOS and 1100 V UMOS 4H-SiC Power FETs," *IEEE Device Research Conference*, Ft. Collins, CO Jun. 23-25, 1997.

J.N. Shenoy, J.A. Cooper and M.R. Meelock, "High-Voltage Double-Implanted Power MOSFETs in 6H-SiC," *IEEE Electron Device Letters*, vol. 18, No. 3, pp. 93-95, Mar. 1997.

Jamet, et al. "Physical properties of N₂O and NO-nitrided gate oxides grown on 4H SiC," *Applied Physics Letters*. vol. 79, No. 3, Jul. 16, 2001, pp. 323-325.

K. Ueno and Tadaaki Oikawa, "Counter-Doped MOSFET's of 4H-SiC," *IEEE Electron Device Letters*, vol. 20, No. 12, pp. 624-626, Dec. 1999.

K. Ueno, R. Asai, and T. Tsuji. "4H-SiC MOSFET's Utilizing the H2 Surface Cleaning Technique." *IEEE Electron Device Letters*, vol. 19, No. 7, Jul. 1998, pp. 244-246.

L.A. Lipkin and J.W. Palmour, "Low interface state density oxides on p-type SiC," Materials Science Forum vols. 264-268, pp. 853-856, 1998.

Lai et al., "Interface Properties of N₂O-Annealed NH₃-Treated 6H-SiC MOS Capacitor," *Proc. 1999 IEEE Hong Kong Electron Devices Meeting*, Jun. 26, 1999, pp. 46-49.

Leonhard et al. "Long term stability of gate-oxides on n- and p-type silicon carbide studied by charge injection techniques," *Materials Science Engineering*, vol. 46, No. 1-3, Apr. 1997, pp. 263-266.

Lipkin et al. "Insulator Investigation on SiC for Improved Reliability," *IEEE Transactions on Electron Devices*. vol. 46, No. 3, Mar. 1999; pp. 525-532.

Lipkin et al. "Challenges and State-of-the-Art Oxides in SiC," *Mat. Res. Soc. Symp. Proc.* vol. 640, 2001, pp. 27-29.

M. K. Das, L.A. Lipkin, J.W. Palmour, G.Y. Chung, J.R. Williams, K. McDonald, and L.C. Feldman, "High Mobility 4H-SiC Inversion Mode MOSFETs Using Thermally Grown, NO Annealed SiO₂," *IEEE Device Research Conference*, Denver, CO Jun. 19-21, 2000.

M.A. Capano, S. Ryu, J.A. Cooper, Jr., M.R. Melloch, K. Rottner, S. Karlsson, N. Nordell, A. Powell, and D.E. Walker, Jr., "Surface Roughening in Ion Implanted 4H-Silicon Carbide," *Journal of Electronic Materials*, vol. 28, No. 3, pp. 214-218, Mar. 1999.

M.K. Das, J.A. Cooper, Jr., M.R. Melloch, and M.A. Capano, "Inversion Channel Mobility in 4H- and 6H-SiC MOSFETs," *IEEE Semiconductor Interface Specialists Conference*, San Diego, CA, Dec. 3-5, 1998.

P.J. Tobin, Y. Okada, S. A. Ajuria, V. Lakhotia, W.A. Fell, and R. I. Hedge, "Furnace formation of silicon oxynitride thin dielectrics in nitrous oxide (N₂0): The role of nitric oxide (NO)." *Journal of Applied Physics*. vol. 75, No. 3, Feb. 1, 1994, pp. 1811-1817.

P.M. Shenoy and B.J. Baliga, "The Planar 6H-SiC ACCUFET: A New High-Voltage Power MOSFET Structure," *IEEE Electron Device Letters*, vol. 18, No. 12, pp. 589-591, Dec. 1997.

P.T. Lai, Supratic Chakraborty, C.L. Chan, and Y.C. Cheng, "Effects of nitridation and annealing on interface properties of thermally oxidized SiO₂/SiC metal-oxide-semiconductor system," *Applied Physics Letters*, vol. 76, No. 25, pp. 3744-3746, Jun. 2000.

Pantelides et al., "Atomic-Scale Engineering of the SiC-SiO2 Interface," *Materials Science Forum*. (2000) vols. 338-342, pp. 1133-1136.

R. Schörner, P. Friedrichs, D. Peters, H. Mitlehner, B. Weis, and D. Stephani, "Rugged Power MOSFETs in 6H-SiC with Blocking Capability up to 1800 V," *Materials Science Forum* vols. 338-342, pp. 1295-1298, 2000.

R. Schomer, P. Friedrichs, D. Peters, and D. Stephani, "Significantly Improved Performance of MOSFETs on Silicon Carbide Using the 15R-SiC Polytype," *IEEE Electron Device Letters*, vol. 20, No. 5, pp. 241-244, May 1999.

Ranbir Singh, Sei-Hyung Ryu and John W. Palmour, "High Temperature, High Current, 4H-SiC Accu-DMOSFET," Materials Science Forum vols. 338-342, pp. 1271-1274, 2000.

S. Sridevan and B. Jayant Baliga, "Lateral N-Channel Inversion Mode 4H-SiC MOSFET's," *IEEE Electron Device Letters*, vol. 19, No. 7, pp. 228-230, Jul. 1998.

S. Sridevan, P.K. McLarty, and B.J. Baliga, "On the Presence of Aluminum in Thermally Grown Oxides on 6H-Silicon Carbide," *IEEE Electron Device Letters*, vol. 17, No. 3, pp. 136-138, Mar. 1996.

S.T. Pantelides, "Atomic Scale Engineering of SiC Dielectric Interfaces," DARPA/MTO High Power and ONR Power Switching MURI Reviews, Rosslyn, VA, Aug. 10-12, 1999.

Suzuki et al. "Effect of Post-oxidation-annealing in Hydrogen on SiO₂/4H-SiC Interface," *Materials Science Forum*, vols. 338-342 (2000) 1073-6.

Sze, S.M. *Physics of Semiconductor Devices*, John Wiley & Sons, p. 383-390, 1981.

V.R. Vathulya and M.H. White, "Characterization of Channel Mobility on Implanted SiC to Determine Polytype Suitability for the Power DIMOS Structure," *Electronic Materials Conference*, Santa Barbara, CA, Jun. 30-Jul. 2, 1999.

V.R. Vathulya, H. Shang, and M.H. White, "A Novel 6H-SiC Power DMOSFET with Implanted P-Well Spacer," *IEEE Electronic Device Letters*, vol. 20, No. 7, Jul. 1999, pp. 354-356.

V.V. Afanasev, M. Bassler, G. Pensl, and M. Schulz, "Intrinsic SiC/SiO₂ Interface States," *Phy. Stat. Sol.* (a), vol. 162, pp. 321-337, 1997.

Wang et al. "High Temperature Characteristics of High-Quality SiC MIS Capacitors with O/N/O Gate Dielectric," *IEEE Transactions on Electron Devices*. vol. 47, No. 2, Feb. 2000, pp. 458-462.

Xu et al. "Improved Performance and Reliability of N₂0-Grown Oxynitride on 6H-SiH," *IEEE Electron Device Letters*. vol. 21, No. 6, Jun. 2000, p. 298-300.

Y. Wang, C. Weitzel, and M. Bhatnagar, "Accumulation-Mode SiC Power MOSFET Design Issues," *Materials Science Forum*, vols. 338-342, pp. 1287-1290.

Palmour et al. "SiC Device Technology: Remaining Issues," Diamond and Related Materials. vol. 6, 1997, pp. 1400-1404.

Rao at al. "P-N Junction Formation in 6H-SiC by Acceptor Implantation into N-Type Substrate," Nuclear Instruments and Methods in Physics Research B. vol. 106, 1995, pp. 333-338.

Rao et al. "Al and N Ion Implantations in 6H-SiC," Silicon Carbide and Related Materials. 1995 Conf, Kyoto, Japan. Published 1996.

Capano, M.A., et al., Ionization Energies and Electron Mobilities in Phosphorus—and Nitrogen-Implanted 4H-Silicon Carbide, IEEE ICSCRM Conference 1999, Research Triangle Park, North Carolina (Oct. 10-13, 1999).

Patel, R., et al., Phosphorus-Implanted High-Voltage N.sup.+P 4H-SiC Junction Rectifiers, Proceedings of 1998 International Symposium on Poer Semiconductor Devices & ICs, pp. 387-390 (Kyoto).

Dastidar, Sujoyita, A Study of P-Type Activation in Silicon Carbide, Thesis (Purdue University, May 1998).

U.S. Appl. No. 10/686,795, "Methods of Forming Power Semiconductor Devices Using Boule-Grown Silicon Carbide Drift Layers and Power Semiconductor Devices Formed Thereby," filed Oct. 16, 2003.

International Search Report for PCT/US03/38490 mailed Aug. 5, 2004.

Bhatnagar et al. "Comparison of 6H-SiC, 3C-SiC, and Si for Power Devices," *IEEE Transactions on Electron Devices*, vol. 40, No. 3, Mar. 1993, pp. 645-655.

Baliga, Power Semiconductor Devices, Chapter 7, PWS Publishing, 1996.

U.S. Appl. No. 60/435,212.

U.S. Appl. No. 60/294,307.

U.S. Appl. No. 10/422,130.

Mutin, P. Herbert, "Control of the Composition and Structure of Silicon Oxycarbide and Oxynitride Glasses Derived from Polysiloxane Precursors," *Journal of Sol-Gel Science and Technology*. vol. 14 (1999) pp. 27-38.

del Prado et al. "Full Composition Range Silicon Oxynitride Films Deposited by ECR-PECVD at Room Temperatures," *Thin Solid Films*. vol. 343-344 (1999) p. 437-440.

Kobayashi et al. "Dielectric Breakdown and Current Conduction of Oxide/Nitride/Oxide Multi-Layer Structures," *1990 IEEE Symposium on VLSI Technology*. pp. 119-120.

Ma et al. "Fixed and trapped charges at oxide-nitride-oxide heterostructure interfaces formed by remote plasma enhanced chemical vapor deposition," *J. Vac. Sci. Technol. B*. vol. 11, No. 4, Jul./Aug. 1993, pp. 1533-1540.

Dimitrijev et al., "Nitridation of Silicon-Dioxide Films Grown on 6H Silicon Carbide", *IEEE Electronic Device Letters*, vol. 18, No. 5, May 5, 1997, pp. 175-177.

De Meo et al., "Thermal Oxidation of SiC in $N_2O$", *J. Electrochem. Soc.*, vol. 141, 1994, pp. L150-L152.

Dahlquist et al. "A 2.8kV, Forward Drop JBS Diode with Low Leakage," *Materials Science Forum*, vols. 338-342, (2000) pp. 1179-1182.

Mondal et al. "An Integrated 500-V Power DSMOSFET/Antiparallel Rectifier Device with Improved Diode Reverse Recovery Characteristics," *IEEE Electron Device Letters*, vol. 23, No. 9, Sep. 2002, pp. 562-564.

Motorola Power MOSFET Transistor Databook, 4th edition. Motorola, INc., 1989, pp. 2-5-4-2-5-7.

Ryu et al. Article and Presentation: "27 $m\Omega\text{-}cm^2$, 1.6 kV Power DiMOSFETs in 4H-SiC," *Proceedings of the 14 International Symposium on Power Semiconductor Devices & ICs 2002*, Jun. 4-7, 2002, Santa Fe, NM.

Chung et al. "Effects of anneals in ammonia on the interface trap density near athe band edges in 4H-silicon carbide metal-oxide-semiconductor capacitors," *Applied Physics Letters*. vol. 77, Nov. 27, 2000, pp. 3601-3603.

Williams et al. "Passivation of the 4H-SiC/$SiO_2$ Interface with Nitric Oxide," *Materials Science Forum*. vols. 389-393 (2002), pp. 967-72.

Japanese Official Action; Mailing Date: Oct. 15, 2010 corresponding to JP Patent Application No. 2004-565192; 5 pages.

\* cited by examiner $BV > 3150$ V with $V_{GS} = -4$ V $BV > 3150$ V with $V_{GS} = -5$ V

METHODS OF FABRICATING VERTICAL JFET LIMITED SILICON CARBIDE METAL-OXIDE SEMICONDUCTOR FIELD EFFECT TRANSISTORS

CROSS-REFERENCE TO RELATED APPLICATIONS

This application is a divisional of U.S. application Ser. No. 10/698,170, Filed Oct. 30, 2003, now U.S. Pat. No. 7,221,010, entitled VERTICAL JFET LIMITED SILICON CARBIDE POWER METAL-OXIDE SEMICONDUCTOR FIELD EFFECT TRANSISTORS, which claims priority from U.S. Provisional Application Ser. No. 60/435,212, filed Dec. 20, 2002 entitled VERTICAL JFET LIMITED SILICON CARBIDE POWER METAL-OXIDE SEMICONDUCTOR FIELD EFFECT TRANSISTORS AND METHODS OF FABRICATING VERTICAL JFET LIMITED SILICON CARBIDE POWER METAL-OXIDE SEMICONDUCTOR FIELD EFFECT TRANSISTORS, the disclosures of which are hereby incorporated herein by reference in their entireties as if set forth fully herein.

STATEMENT OF GOVERNMENT INTEREST

The present invention was made, at least in part, with support from the United States Office of Naval Research, contract number N00014-02-C-0302. The Government may have certain rights in this invention.

FIELD OF THE INVENTION

The present invention relates to semiconductor devices and the fabrication of semiconductor devices and more particularly, to silicon carbide (SiC) metal-oxide semiconductor field effect transistors (MOSFETs) and the fabrication of such MOSFETs.

BACKGROUND OF THE INVENTION

To make a high current, high voltage, low on-resistance, vertical SiC power MOSFET has, so far, been impractical, at least in part, due to the poor surface mobility of electrons in the inversion layer. Recently, some processing techniques have been developed on a lateral MOSFET structure, which result in an improved surface electron mobility. However, a power MOSFET structure may involve additional processing including, for example, anneals at temperatures of greater than 1500° C. for the activation of p-type dopants, for example, p-well/p+ contact/p− Junction Termination Extension (JTE) implants. Such anneals may have detrimental impact on the performance of power MOSFETs fabricated using such techniques.

A number of silicon carbide power MOSFET structures have been described in the literature. See e.g. U.S. Pat. No. 5,506,421; A. K. Agarwal, J. B. Casady, L. B. Rowland, W. F. Valek, M. H. White, and C. D. Brandt, "1.1 kV 4H—SiC Power UMOSFET's," IEEE Electron Device Letters, Vol. 18, No. 12, pp. 586-588, December 1997; A. K. Agarwal, J. B. Casady, L. B. Rowland, W. F. Valek and C. D. Brandt, "1400 V 4H—SiC Power MOSFETs," Materials Science Forum Vols. 264-268, pp. 989-992, 1998; J. Tan, J. A. Cooper, Jr., and M. R. Melloch, "High-Voltage Accumulation-Layer UMOSFETs in 4H—SiC," IEEE Electron Device Letters, Vol. 19, No. 12, pp. 487-489, December 1998; J. N. Shenoy, J. A. Cooper and M. R. Melloch, "High-Voltage Double-Implanted Power MOSFET's in 6H—SiC," IEEE Electron Device Letters, Vol. 18, No. 3, pp. 93-95, March 1997; J. B. Casady, A. K. Agarwal, L. B. Rowland, W. F. Valek, and C. D. Brandt, "900 V DMOS and 1100 V UMOS 4H—SiC Power FETs," IEEE Device Research Conference, Ft. Collins, Colo., Jun. 23-25, 1997; R. Schörner, P Friedrichs, D. Peters, H. Mitlehner, B. Weis and D. Stephani, "Rugged Power MOSFETs in 6H—SiC with Blocking Capability up to 1800 V," Materials Science Forum Vols. 338-342, pp. 1295-1298, 2000; V. R. Vathulya and M. H. White, "Characterization of Channel Mobility on Implanted SiC to determine Polytype suitability for the Power DIMOS structure," Electronic Materials Conference, Santa Barbara, Calif., Jun. 30-Jul. 2, 1999; A. V. Suvorov, L. A. Lipkin, G. M. Johnson, R. Singh and J. W. Palmour, "4H—SiC Self-Aligned Implant-Diffused Structure for Power DMOSFETs," Materials Science Forum Vols. 338-342, pp. 1275-1278, 2000; P. M. Shenoy and B. J. Baliga, "The Planar 6H—SiC ACCUFET: A New High-Voltage Power MOSFET Structure," IEEE Electron Device Letters, Vol. 18, No. 12, pp. 589-591, December 1997; Ranbir Singh, Sei-Hyung Ryu and John W. Palmour, "High Temperature, High Current, 4H—SiC Accu-DMOSFET," Materials Science Forum Vols. 338-342, pp. 1271-1274, 2000; Y. Wang, C. Weitzel and M. Bhatnagar, "Accumulation-Mode SiC Power MOSFET Design Issues," Materials Science Forum Vols. 338-342, pp. 1287-1290, 2000; and A. K. Agarwal, N. S. Saks, S. S. Mani, V. S. Hegde and P. A. Sanger, "Investigation of Lateral RESURF, 6H—SiC MOSFETs," Materials Science Forum Vols. 338-342, pp. 1307-1310, 2000.

The existing SiC structures can, generally, be divided into three categories: (1) Trench or UMOSFET, (2) Vertical Doubly Implanted MOSFET (DIMOSFET), and (3) Lateral Diffused MOSFET (LDMOSFET). Of these structures, the vertical DIMOSFET structure, illustrated in FIG. 1, is a variation of the diffused (DMOSFET) structure employed in silicon technology. Typically, the p-wells are implanted with Al or Boron, the source regions ($n^+$) are implanted with nitrogen or phosphorus, and the $p^+$ regions are usually implanted with Al. The implants are activated at temperatures between 1400° C.-1700° C. The contacts to $n^+$ layers are made with nickel (Ni) and annealed and the contacts to $p^+$ are made by Ni, Ti or Ti/Al. Both contacts are annealed at high temperatures. The gate dielectric is, typically, either thermally grown (Thermal $SiO_2$) or deposited using Low Pressure Chemical Vapor Deposition (LPCVD) technique and subsequently annealed in various ambients. The deposited dielectric may, for example, be $SiO_2$ or an Oxide/Nitride/Oxide (ONO) stack.

The interface states near the conduction band edge tend to trap the otherwise free electrons from the inversion layer leaving a relatively small number of free electrons in the inversion layer. Also the trapped electrons may create negatively charged states at the interface which coulomb scatter the free electrons. The reduced number of free electrons and the increased scattering may reduce the conduction of current from source to drain, which may result in low effective mobility of electrons and a high on-resistance. Several factors have been attributed to the high density of states near the conduction band edge: (1) carbon or silicon dangling bonds, (2) carbon clusters, and (3) Si—Si bonds creating a thin amorphous silicon layer at the interface. See S. T. Pantelides, "Atomic Scale Engineering of SiC Dielectric Interfaces," DARPA/MTO High Power and ONR Power Switching MURI Reviews, Rosslyn, Va., Aug. 10-12, 1999 and V. V. Afanas'ev, M. Bassler, G. Pensl, and M. Schulz, "Intrinsic $SiC/SiO_2$ Interface States," Phys. Stat. Sol. (a), Vol. 162, pp. 321-337, 1997.

In addition to the high density of interface states, several other mechanisms have also been attributed to the poor mobility of inversion layer electrons: (1) Al segregating out of the Al-doped, p-type SiC, and (2) Surface roughness created by the high temperature activation of implanted impurities. See S. Sridevan, P. K. McLarty, and B. J. Baliga, "On the Presence of Aluminum in Thermally Grown Oxides on 6H-Silicon Carbide," IEEE Electron Device Letters, Vol. 17, No. 3, pp. 136-138, March 1996 and M. A. Capano, S. Ryu, J. A. Cooper, Jr., M. R. Melloch, K. Rottner, S. Karlsson, N. Nordell, A. Powell, and D. E. Walker, Jr., "Surface Roughening in Ion Implanted 4H-Silicon Carbide," Journal of Electronic Materials, Vol. 28, No. 3, pp. 214-218, March, 1999. Researchers from Purdue University have concluded that a direct correlation exists between the inversion layer electron mobility and the implant activation temperature. Such research has concluded that lower implant activation temperature (1200° C.) leads to higher electron mobility and higher activation temperature (1400° C.) results in poor electron mobility. See M. K. Das, J. A. Cooper, Jr., M. R. Melloch, and M. A. Capano, "Inversion Channel Mobility in 4H— and 6H—SiC MOSFETs," IEEE Semiconductor Interface Specialists Conference, San Diego, Calif., Dec. 3-5, 1998. These results have been obtained on planar MOSFETs, which do not utilize an implantation of the p-well. The p-well implanted impurity (Al or Boron) typically requires at least a 1500° C. activation temperature.

A further difficulty with DIMOSFETS may be associated with the "JFET" region of the device. As seen in FIG. 1, a depletion region may be formed in the n⁻ drift region around the p-well. This depletion region may effectively make the channel length longer than the p-well junction depth as current flow is provided around the depletion region. It has been suggested that a spacer implant be introduced between the p-well regions to alleviate this problem. See Vathulya et al, "A Novel 6H—SiC DMOSFET With Implanted P-Well Spacer", IEEE Electron Device Letters, Vol. 20, No. 7, p. 354, July 1999. This spacer implant does not extend past the p-well regions and does not significantly reduce the JFET resistance if the depletion region formed at the p-well and the n⁻ drift region interface extends deep into the n⁻ drift region.

SUMMARY OF THE INVENTION

Embodiments of the present invention provide silicon carbide metal-oxide semiconductor field effect transistors (MOSFETs) and methods of fabricating silicon carbide MOSFETs having an n-type silicon carbide drift layer, a first p-type silicon carbide region adjacent the drift layer and having a first n-type silicon carbide region therein, and an oxide layer on the drift layer. The MOSFETs also have an n-type silicon carbide limiting region disposed between the n-type silicon carbide drift layer and a portion of the first p-type silicon carbide region. In some embodiments, the n-type limiting region has a carrier concentration that is greater than the carrier concentration of the n-type silicon carbide drift layer.

In further embodiments of the present invention, the n-type silicon carbide limiting region is provided between the drift layer and a floor of the first p-type silicon carbide region. In still further embodiments, the n-type limiting region is also provided adjacent a sidewall of the first p-type silicon carbide region. In some embodiments of the present invention, a portion of the limiting region adjacent the floor of the first p-type region has a higher carrier concentration than a portion of the limiting region adjacent the sidewall of the first p-type region.

In particular embodiments of the present invention, the first p-type silicon carbide region is implanted with aluminum.

Further embodiments of the present invention provide a gate contact on the oxide layer, a source contact on the first n-type silicon carbide layer, and a drain contact on the drift layer opposite the oxide layer. In particular embodiments of the present invention, the gate contact is polysilicon (either p-type or n-type). In other embodiments, the gate contact is metal. In some embodiments, an n-type silicon carbide substrate is provided between the drift layer and the drain contact.

In certain embodiments of the present invention, the n-type limiting region is provided by an epitaxial layer of silicon carbide on the n-type silicon carbide drift layer. In such embodiments, the first p-type region is provided in but not through the epitaxial layer of silicon carbide.

In further embodiments, the n-type limiting region is provided by an implanted n-type region in the drift layer. In some embodiments, the n-type limiting region has a thickness of from about 0.5 µm to about 1.5 µm. In certain embodiments, the n-type limiting region has a carrier concentration of from about $1 \times 10^{15}$ to about $5 \times 10^{17}$ cm$^{-3}$.

In still further embodiments of the present invention, an n-type epitaxial layer is provided on the first p-type region and a portion of the first n-type region. The epitaxial layer is provided between the first n-type silicon carbide region and the first p-type silicon carbide region and the oxide layer.

In some embodiments, a second p-type silicon carbide region is provided within the first p-type silicon carbide region and adjacent the first n-type silicon carbide region.

In additional embodiments of the present invention, a silicon carbide device is provided having a drift layer of n-type silicon carbide and first regions of p-type silicon carbide. The first regions of p-type silicon carbide are spaced apart and have peripheral edges that define a first region of n-type silicon carbide therebetween. Second regions of n-type silicon carbide having a carrier concentration greater than a carrier concentration of the drift layer are provided in the first regions of p-type silicon carbide and are spaced apart from the peripheral edges of the first regions of p-type silicon carbide. An oxide layer is provided on the drift layer, the first region of n-type silicon carbide and the second regions of n-type silicon carbide. Third regions of n-type silicon carbide having a carrier concentration greater than the carrier concentration of the drift layer are provided beneath the first regions of p-type silicon carbide and between the first regions of p-type silicon carbide and the drift layer. Source contacts are provided on portions of the second regions of n-type silicon carbide. A gate contact is provided on the oxide layer, and a drain contact is provided on the drift layer opposite the oxide layer.

In particular embodiments of the present invention, the third regions of n-type silicon carbide are also provided adjacent the peripheral edges of the first regions of p-type silicon carbide that define the first region of n-type silicon carbide. In certain embodiments of the present invention, the first region of n-type silicon carbide and the third regions of n-type silicon carbide are provided by a first n-type silicon carbide epitaxial layer on the drift layer, and the first regions of p-type silicon carbide are provided in the first n-type silicon carbide epitaxial layer. In other embodiments of the present invention, the third regions of n-type silicon carbide are provided by implanted n-type regions in the drift layer.

In some embodiments of the present invention, the first region of n-type silicon carbide is a region of the drift layer. In other embodiments, the first region of n-type silicon carbide may have a higher carrier concentration than the carrier concentration of the drift layer, and may have a lower carrier concentration than the carrier concentration of the third regions of n-type silicon carbide.

In still further embodiments of the present invention, an epitaxial layer of silicon carbide is provided on the first p-type regions and the first region of n-type silicon carbide.

In other embodiments of the present invention, an n-type silicon carbide layer with a higher carrier concentration than the drift layer is provided between the drift layer and the drain contact. In such embodiments, the n-type silicon carbide layer may be an n-type silicon carbide substrate.

In further embodiments, second p-type silicon carbide regions are provided within the first p-type silicon carbide regions.

In some embodiments of the present invention, the third regions of n-type silicon carbide have a thickness of from about 0.5 μm to about 1.5 μm and a carrier concentration of from about $1 \times 10^{15}$ to about $5 \times 10^{17}$ $cm^{-3}$.

In additional embodiments of the present invention, a silicon carbide device is provided having an n-type silicon carbide drift layer, spaced apart p-type silicon carbide well regions, and an n-type silicon carbide limiting region between the well regions and the drift layer. In particular embodiments, the n-type limiting region is provided between the spaced apart p-type well regions. In some embodiments, the n-type limiting region has a higher carrier concentration than a carrier concentration of the drift layer. In further embodiments, the n-type limiting region is provided by an epitaxial layer of silicon carbide on the drift layer, and the p-type well regions are provided in but not through the epitaxial layer.

Methods of fabricating devices according to embodiments of the present invention are also provided.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. As illustrated in the Figures, the sizes of layers or regions are exaggerated for illustrative purposes and, thus, are provided to illustrate the general structures of the present invention. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Embodiments of the present invention provide silicon carbide MOSFETs and/or methods of fabricating silicon carbide MOSFETs which may reduce on-state resistance of a device. While the inventors do not wish to be bound by any theory of operation, it is believed that by reducing the depletion region beneath the p-well of the MOSFET, the length of the current path may be reduced and, therefore, the on-state resistance of the device may be reduced over that of a similarly sized conventional MOSFET. Furthermore, by reducing the depletion region in the JFET gap, device areas may be reduced by reducing the size of the JFET gap.

Figure 1:
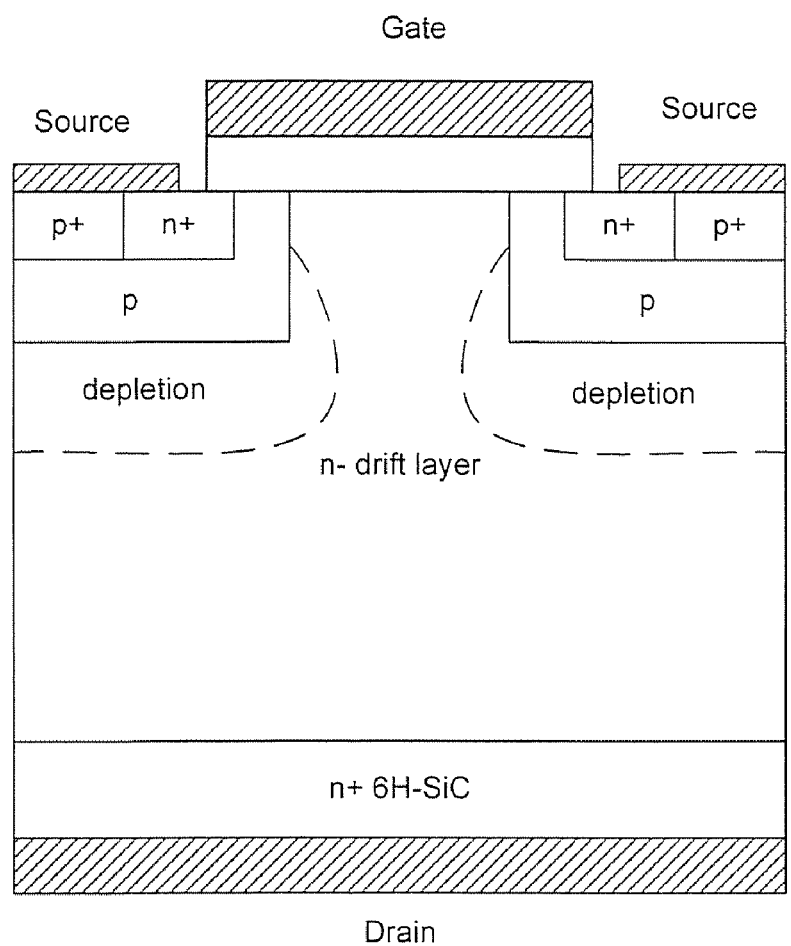
FIG. 1 is a cross-sectional view of a conventional DIMOSFET.
Figure 2A:
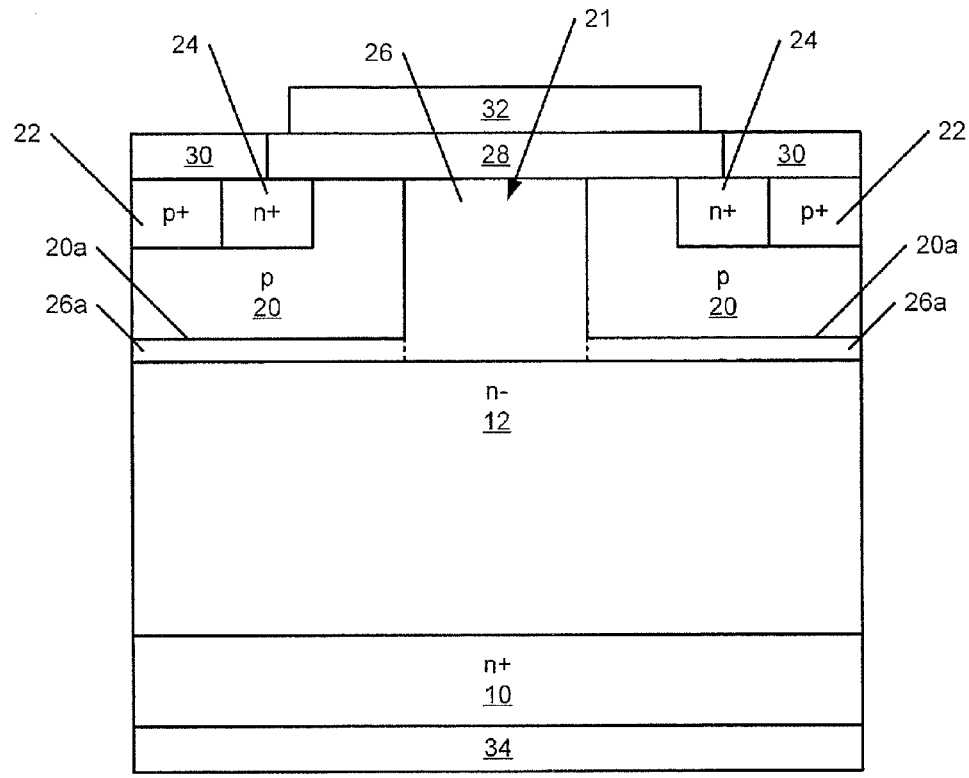
FIG. 2A is a cross-sectional view of a SiC MOSFET according to embodiments of the present invention.

MOSFETs according to embodiments of the present invention are illustrated in FIG. 2A. As seen in FIG. 2A, in particular embodiments of the present invention, a lightly doped n⁻ drift layer 12 of silicon carbide is on an optional n⁺ layer 10 of silicon carbide. The n⁻ drift layer 12 may be a substrate or an epitaxial layer of silicon carbide and may, for example, be 4H polytype silicon carbide. In certain embodiments, the $n^{-3}$ drift layer 12 has a carrier concentration of from about $10^{14}$ to about $5 \times 10^{16}$ $cm^{-3}$. Furthermore, in some embodiments of the present invention, the drift layer 12 has a thickness of from about 5 μm to about 150 μm. Furthermore, the n⁺ layer 10 may be an implanted layer or region, an epitaxial layer or a substrate. In some embodiments, the n⁺ layer has a carrier concentration of from about $10^{18}$ to about $10^{21}$ $cm^{-3}$.

A region of higher carrier concentration n-type silicon carbide 26 is provided on the drift layer 12. The region 26 has a higher carrier concentration than the carrier concentration of the drift layer 12 and provides an embodiment of a JFET limiting region 26a between a floor 20a of the p-wells 20 and the drift layer 12. The region 26 may be provided by epitaxial growth or by implantation. In certain embodiments of the present invention, the region 26 has thickness of from about 0.5 μm to about 1.5 μm. Also, the region 26 may have a carrier concentration of from about $10^{15}$ to about $5 \times 10^{17}$ $cm^{-3}$. The region 26 may have a uniform carrier concentration or a non-uniform carrier concentration.

As is further seen in FIG. 2A, spaced apart regions of p-type silicon carbide provide p-wells 20 in the region 26. The p-wells 20 are implanted so as to extend into but not through the region 26 such that a region of higher carrier concentration n-type silicon carbide 26a is provided between a floor 20a of the p-wells 20 and the drift layer 12. In particular embodiments, the portion of the region 26 in the gap 21 between the p-wells 20 has a higher carrier concentration than the drift layer 12. In other embodiments of the present invention, the portion of the region 26 in the gap 21 between the p-wells 20 has the same carrier concentration as the drift layer 12. Thus, the portion of the region 26 adjacent the sidewalls of the p-wells 20 may have the same or higher carrier concentration than the drift layer 12 while the portion 26a of the region 26 adjacent the floor 20a of the p-wells 20 has a higher carrier concentration than the drift layer 12. In particular embodiments, the p-wells 20 have a carrier concentration of from about $10^{16}$ to about $10^{19}$ cm$^{-3}$. Furthermore, the p-wells 20 may provide a junction depth of from about 0.3 μm to about 1.2 μm.

Figure 2B:
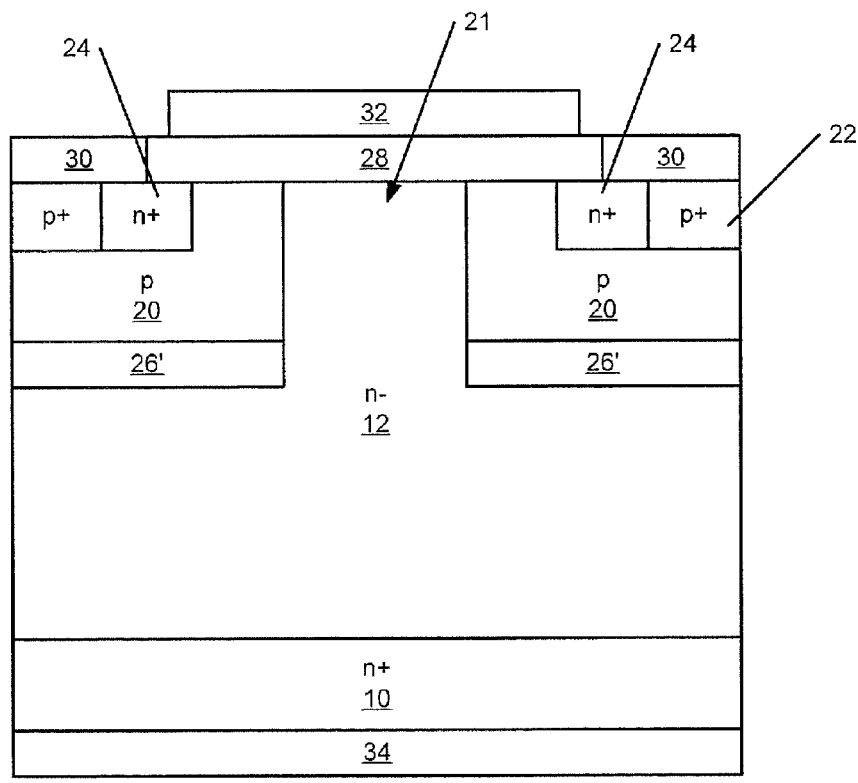
FIG. 2B is a cross-sectional view of a SiC MOSFET according to embodiments of the present invention.

An example of embodiments of the present invention where the gap 21 and the area beneath the p-wells 20 have different carrier concentrations is illustrated in FIG. 2B. As seen in FIG. 2B, regions 26' are provided beneath the floor of the p-wells 20 and between the p-wells 20 and the drift layer 12 to provide the JFET limiting regions. However, the drift layer 12 is provided in the gap 21 between the p-wells 20. The regions 26' may be provided, for example, by implanting n-type regions 26' in the drift layer 12 using a mask and implanting the p-wells 20 so that the depth of the p-wells 20 in the drift layer 12 is less than the greatest depth of the regions 26' in the drift layer 12. Similarly, an n-well could be formed in the drift layer 12 and the p-wells 20 formed in the n-well.

In some embodiments, the p-wells 20 are implanted with Al and annealed at a temperature of at least about 1500° C. However, other suitable p-type dopant may be utilized in providing the p-wells 20. The doping profile of the p-wells 20 may be a substantially uniform profile, a retrograde profile (increasing doping with depth) or the p-wells may be totally buried (with some n-type silicon carbide above the p-wells 20). In some embodiments, the p-wells 20 may have carrier concentrations of from about $1 \times 10^{16}$ to about $1 \times 10^{19}$ cm$^{-3}$ and may extend into the region 26 or the n$^-$ drift layer 12 from about 0.3 μm to about 1.2 μm. While various p-type dopants may be utilized, Al is utilized in some embodiments because Boron tends to diffuse over several microns when annealed at temperatures exceeding 1500° C. Therefore, it may be difficult to control the precise gap between the p-wells 20 (the region which may be referred to as the JFET region 21) and/or the depth of the p-wells 20. If this gap is too high, the field in the gate oxide can become too high when the device is in the blocking state. However, if the gap is too narrow, the resistance of the JFET region 21 may become very high. Accordingly, gaps of from about 1 μm to about 10 μm are preferred. The particular gap utilized for a given device may depend upon the desired blocking voltage and on-state resistance of the device.

Regions of n$^+$ silicon carbide 24 and, optionally, regions of p$^+$ silicon carbide 22 are disposed within the p-wells 20. In some embodiments, the regions of n$^+$ silicon carbide 24 are spaced from about 0.5 μm to about 5 μm from the edge of the p-wells 20 adjacent the JFET region 21. The regions of n$^+$ silicon carbide 24 may have a doping concentration of from about $5 \times 10^{18}$ cm$^{-3}$ to about $10^{21}$ cm$^{-3}$ and may extend to a depth of from about 0.1 μm to about 0.8 μm into the p-wells 20 but are shallower than the depth of the p-wells 20. Suitable n-type dopants include phosphorous and nitrogen or other n-type dopants known to those of skill in the art. The optional regions of p$^+$ silicon carbide 22 may be adjacent the regions of n$^+$ silicon carbide 24 and opposite the edge of the p-wells 20. The regions of p$^+$ silicon carbide 22 may have a doping concentration of from about $5 \times 10^{18}$ cm$^{-3}$ to about $10^{21}$ cm$^{-3}$ and may extend to a depth of from about 0.2 μm to about 1.2 μm into the p-wells 20 but are shallower than the depth of the p-wells 20.

The gate oxide 28 extends at least between the n$^+$ regions of silicon carbide 24 and has a gate contact 32 thereon. In some embodiments, the gate oxide 28 may be either a thermally grown oxide with an NO or N$_2$O anneal or Oxide/Nitride/Oxide (ONO) where the first oxide is a thermal oxide followed by an NO or N$_2$O anneal. The gate contact material may be any suitable contact material. In some embodiments, the gate contact material is molybdenum or p-type polysilicon. P-type polysilicon may be suitable in some embodiments because of its high work function. The thickness of the gate oxide 28 may depend on the work function of the material of the gate contact 32. However, in general, thicknesses of from about 100 Å to about 5000 Å are preferred.

One or more source contacts 30 and a drain contact 34 are also provided. Source contacts 30, in some embodiments are formed of nickel (Ni), titanium (Ti), platinum (Pt) or aluminum (Al), combinations thereof and/or other suitable contact materials and may be annealed at temperatures of from about 600° C. to about 1000° C., for example, 825° C., so as to provide an ohmic contact to both the p$^+$ regions 22 and the n$^+$ regions 24. The drain contact 34 may be Ni or Ti or other such suitable material for forming an ohmic contact to n-type silicon carbide.

Differing or the same contact materials may be utilized to contact the p$^+$ regions 22 and the n$^+$ regions 24. Furthermore, while not illustrated in the Figures, one or more metal overlayers may be provided on one or more of the contacts. Techniques and materials for providing metal overlayers are known to those of skill in the art and, therefore, are not discussed further herein.

Figure 3:
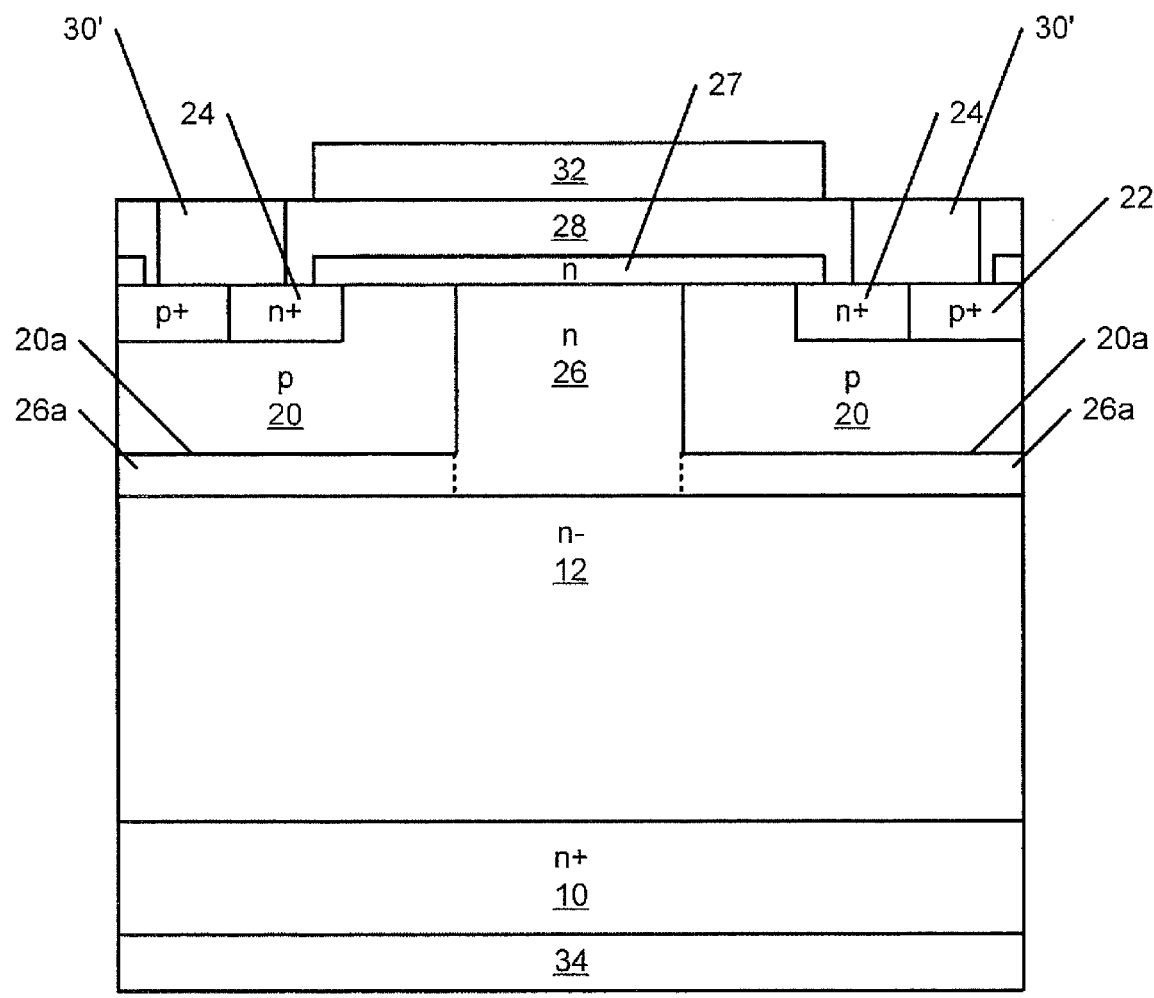
FIG. 3 is a cross-sectional view of a SiC MOSFET according to further embodiments of the present invention.

FIG. 3 illustrates further alternative embodiments of the present invention which utilize a re-grown epitaxial layer. As seen in FIG. 3, a thin layer of silicon carbide 27 is re-grown on the p-wells 20 after implanting and annealing the p-wells and extends across the region 26 in the JFET region. Embodiments such as illustrated in FIG. 2B may also be modified to include such a re-grown epitaxial layer that is re-grown on the p-wells 20 after implanting and annealing the p-wells and extends across the drift layer 12 in the JFET region. The n$^+$ regions of silicon carbide 24 may be formed through the re-grown silicon carbide layer 27 and/or prior to re-growth. The re-grown silicon carbide layer 27 may have a thickness of from about 0.05 μm to about 1 μm in come embodiments. The re-grown silicon carbide layer 27 may be n-type silicon carbide. In certain embodiments, the re-grown silicon carbide layer 27 has a doping of from about $5 \times 10^{14}$ cm$^{-3}$ to about $5 \times 10^{17}$ cm$^{-3}$.

As is further seen in FIG. 3, because of the regrown silicon carbide layer 27, a contact window is provided through the silicon carbide layer 27 to provide a contact 30' to the optional p$^+$ regions 22 or to the p-wells 20 if the p$^+$ regions 22 are not present. The contact 30' may be made of any suitable material for forming an ohmic contact as described above.

While FIGS. 2A, 2B and 3 illustrate embodiments of the present invention as discrete devices, as will be appreciated by those of skill in the art, FIGS. 2A, 2B and 3 may be considered unit cells of devices having multiple cells. Thus, for example, additional unit cells may be incorporated into the devices illustrated in FIGS. 2A, 2B and 3 by dividing the device along its central axis (illustrated as the vertical axis in FIGS. 2A, 2B and 3) and rotating the divided device about an axis of the periphery of the devices illustrated in FIGS. 2A, 2B and 3 (the vertical edges of the devices illustrated in FIGS. 2A, 2B and 3). Accordingly, embodiments of the present invention include devices such as those illustrated in FIGS. 2A, 2B and 3 as well as devices having a plurality of unit cells incorporating the JFET limiting regions illustrated in FIGS. 2A, 2B and 3.

Fabrication of devices according to embodiments of the present invention having a JFET limiting region provided by an epitaxial layer will now be described with reference to FIGS. 4A through 4H and 5A through 5D. As will be appreciated by those of skill in the art in light of the present disclosure, embodiments of the present invention having a JFET limiting region provided by implantation may be provided by modifying the operations described herein to provide such implanted regions as described above.

Figure 4A:
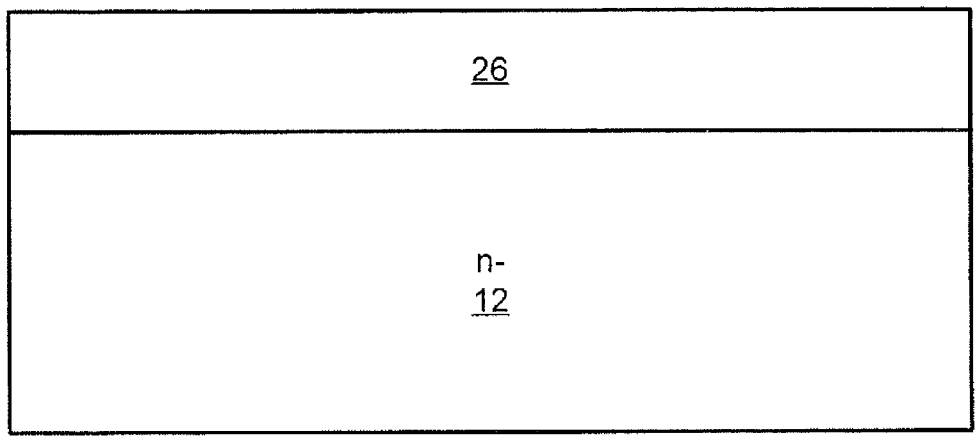
FIGS. 4A through 4H illustrate processing steps in the fabrication of MOSFETS according to various embodiments of the present invention.
Figure 4B:
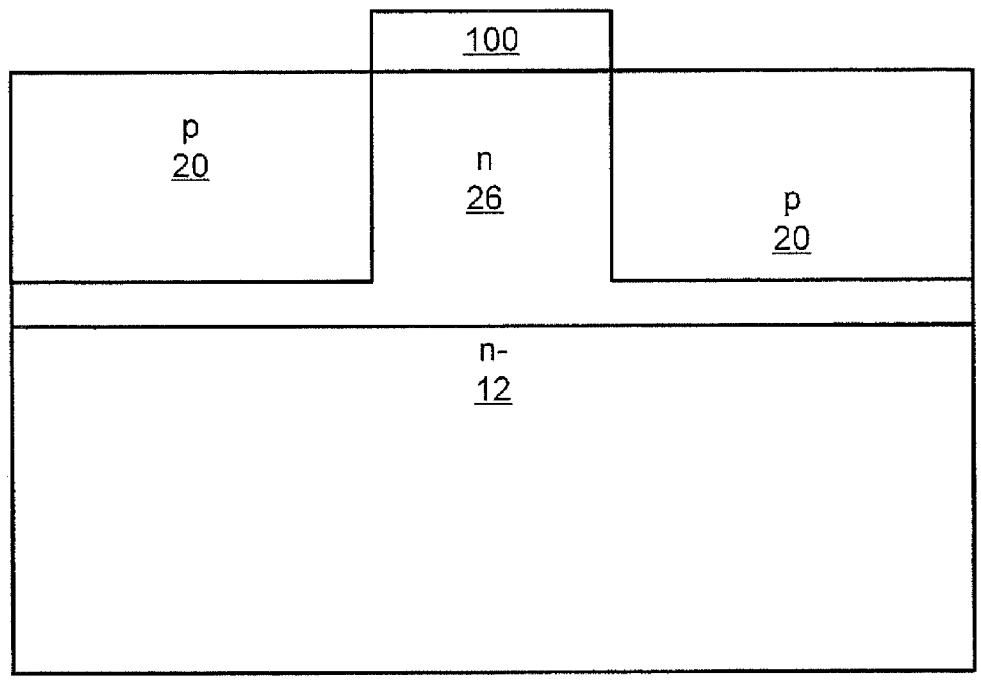

As seen in FIG. 4A, an n-type silicon carbide epitaxial layer 26 is formed on the drift layer 12. The n-type epitaxial layer 26 may be formed to the thickness and doping levels described above. As seen in FIG. 4B, a mask 100 is formed and patterned on the n-type epitaxial layer 26 and impurities are implanted into the n-type epitaxial layer 26 to provide the p-wells 20. The implanted impurities may be implanted to the depths described above and to provide the desired carrier concentrations when activated. Alternatively, the drift layer 12 may be provided on an $n^+$ silicon carbide substrate. In such embodiments, the $n^+$ layer described below may be provided by the substrate.

Figure 4C:
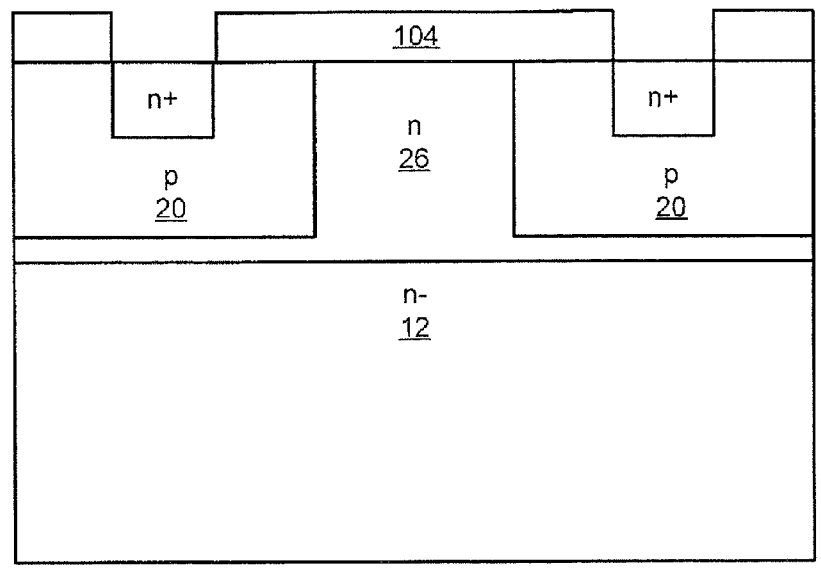

As is seen in FIG. 4C, the mask 100 is removed and a mask 104 is formed and patterned and n-type impurities are implanted utilizing the mask 104 to provide the $n^+$ regions 24. The mask 104 is formed to provide the desired spacing between the periphery of the p-wells 20 and the $n^+$ regions 24 that defines the channel length of the shorting channels 26. Suitable n-type impurities include nitrogen and phosphorous. Furthermore, the impurities may be implanted to provide the dimensions and carrier concentrations of the $n^+$ regions 24 described herein.

Figure 4D:
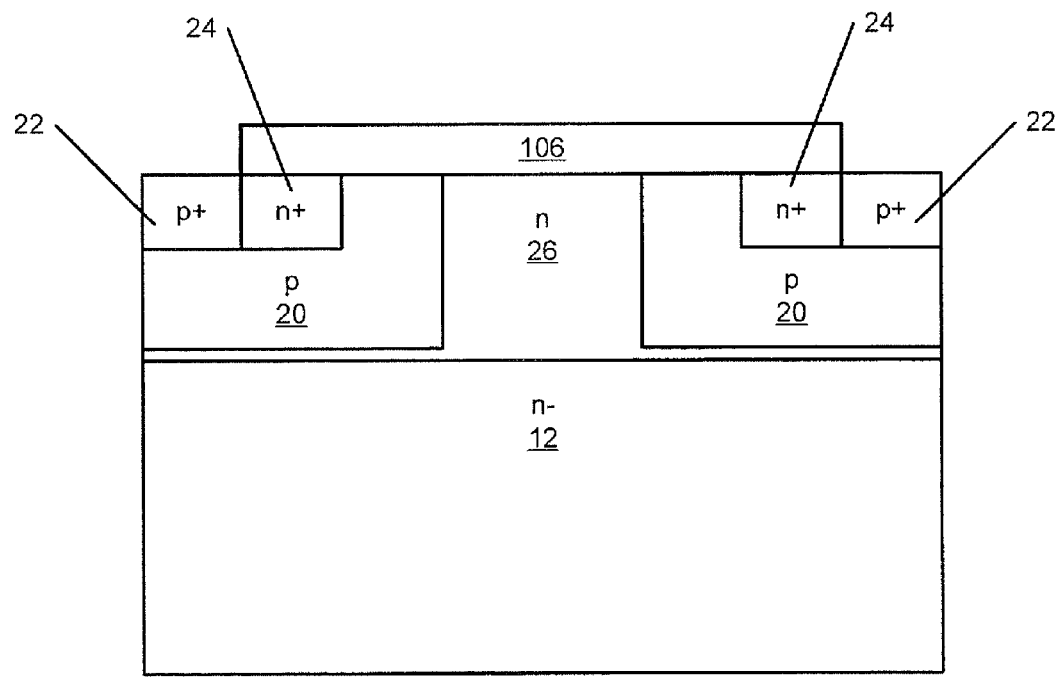

FIG. 4D illustrates the formation of the optional $p^+$ regions. The mask 104 is removed and a mask 106 is formed and patterned and p-type impurities are implanted utilizing the mask 106 to provide the $p^+$ regions 22. The p-type impurities may be implanted to provide the dimensions and carrier concentrations of the $p^+$ regions 22 described herein. In some embodiments, the p-type impurity is aluminum, however, other suitable p-type impurities may also be utilized.

Figure 4E:
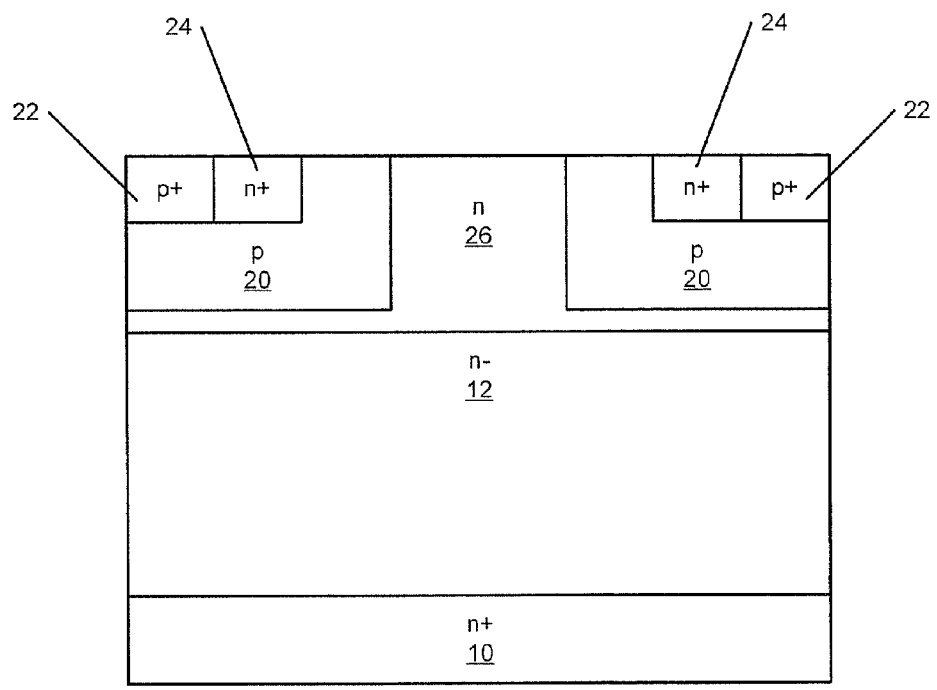

FIG. 4E illustrates the removal of the mask 106 as well as the creation of the $n^+$ layer 10, which may be formed by a backside implant of n-type impurities in a substrate or may be an epitaxial layer or the substrate itself and may be formed prior to FIG. 4A. The structure is also annealed at a temperature of from about 1200° C. to about 1800° C. for durations from about 30 seconds to about 24 hours to activate the implanted p-type and n-type impurities. Optionally, the structure may be capped with a dielectric layer, such as $SiO_2$ or $Si_3N_4$, to protection the structure during annealing. Alternatively, in embodiments where the gate oxide is annealed after formation to improve the $SiC/SiO_2$ interface, the activation of such impurities may be provided by such anneal.

Figure 4F:
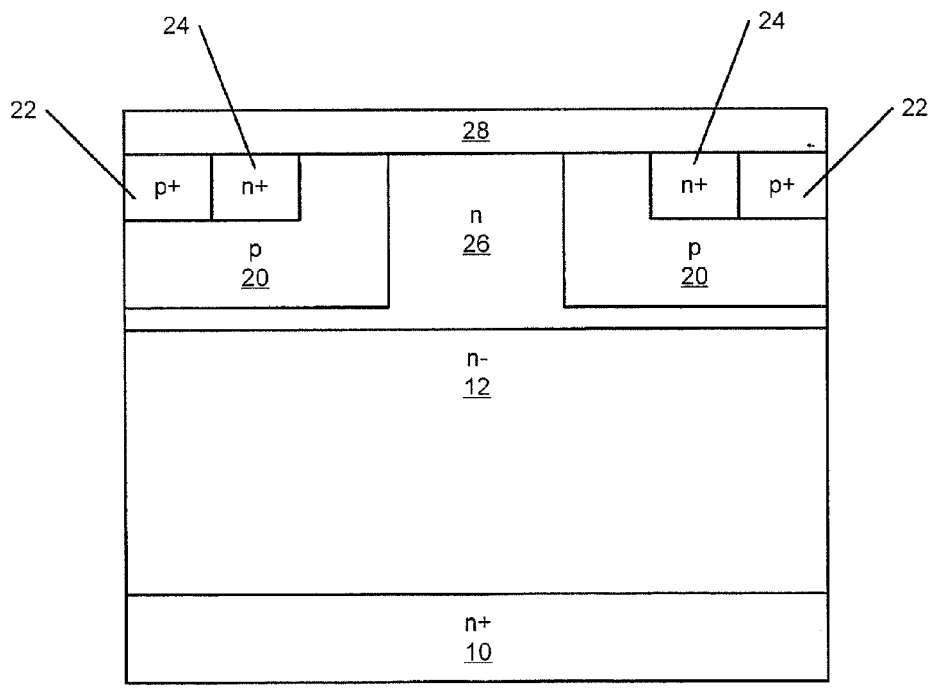

FIG. 4F illustrates the formation of the gate oxide 28. The gate oxide may be thermally grown and may be a nitrided oxide and/or may be other oxides. The nitrided oxide may be any suitable gate oxide, however, in certain embodiments, $SiO_2$, oxynitride or ONO are utilized. Formation of the gate oxide or the initial oxide of an ONO gate dielectric may be followed by an anneal in $N_2O$ or NO so as to reduce defect density at the SiC/oxide interface. In particular embodiments, the gate oxide is formed either by thermal growth or deposition and then annealed in an $N_2O$ environment at a temperature of greater than about 1100° C. and flow rates of from about 2 to about 8 SLM which may provide initial residence times of the $N_2O$ of from about 11 to about 45 seconds. Such formation and annealing of an oxide layer on silicon carbide are described in commonly assigned U.S. patent application Ser. No. 09/834,283, entitled "Method of $N_2O$ Annealing an Oxide Layer on a Silicon Carbide Layer", U.S. Provisional Application Ser. No. 60/237,822 entitled "Method of $N_2O$ Growth of an oxide layer on a Silicon Carbide Layer" filed May 30, 2001, U.S. patent application Ser. No. 09/968,391 entitled "Method Of NO Growth Of An Oxide On A Silicon Carbide Layer" filed Oct. 1, 2001, and/or U.S. patent application Ser. No. 10/045,542 entitled "Method Of Fabricating an Oxide Layer on a Silicon Carbide Layer Utilizing an Anneal in a Hydrogen Environment" filed Oct. 26, 2001, the disclosures of which are incorporated herein by reference as if set forth fully herein.

Additionally, an $N_2O$ grown oxide may also be utilized as described in J. P. Xu, P. T. Lai, C. L. Chan, B. Li, and Y. C. Cheng, "Improved Performance and Reliability of $N_2O$-Grown Oxynitride on 6H—SiC," IEEE Electron Device Letters, Vol. 21, No. 6, pp. 298-300, June 2000. Techniques as described in L. A. Lipkin and J. W. Palmour, "Low interface state density oxides on p-type SiC," Materials Science Forum Vols. 264-268, pp. 853-856, 1998 may also be utilized. Alternatively, for thermally grown oxides, a subsequent NO anneal of the thermally grown $SiO_2$ layer may be provided to reduce the interface trap density as is described in M. K. Das, L. A. Lipkin, J. W. Palmour, G. Y. Chung, J. R. Williams, K. McDonald, and L. C. Feldman, "High Mobility 4H—SiC Inversion Mode MOSFETs Using Thermally Grown, NO Annealed $SiO_2$," IEEE Device Research Conference, Denver, Colo., Jun. 19-21, 2000; G. Y. Chung, C. C. Tin, J. R. Williams, K. McDonald, R. A. Weller, S. T. Pantelides, L. C. Feldman, M. K. Das, and J. W. Palmour, "Improved Inversion Channel Mobility for 4H—SiC MOSFETs Following High Temperature Anneals in Nitric Oxide," IEEE Electron Device Letters accepted for publication; and G. Y. Chung, C. C. Tin, J. R. Williams, K. McDonald, M. Di Ventra, S. T. Pantelides, L. C. Feldman, and R. A. Weller, "Effect of nitric oxide annealing on the interface trap densities near the band edges in the 4H polytype of silicon carbide," Applied Physics Letters, Vol. 76, No. 13, pp. 1713-1715, March 2000. Oxynitrides may be provided as described in U.S. patent application Ser. No. 09/878,442, entitled "High Voltage, High Temperature Capacitor Structures and Methods of Fabrication" filed Jun. 11, 2001, the disclosure of which is incorporated herein by reference as if set forth fully herein.

Figure 4G:
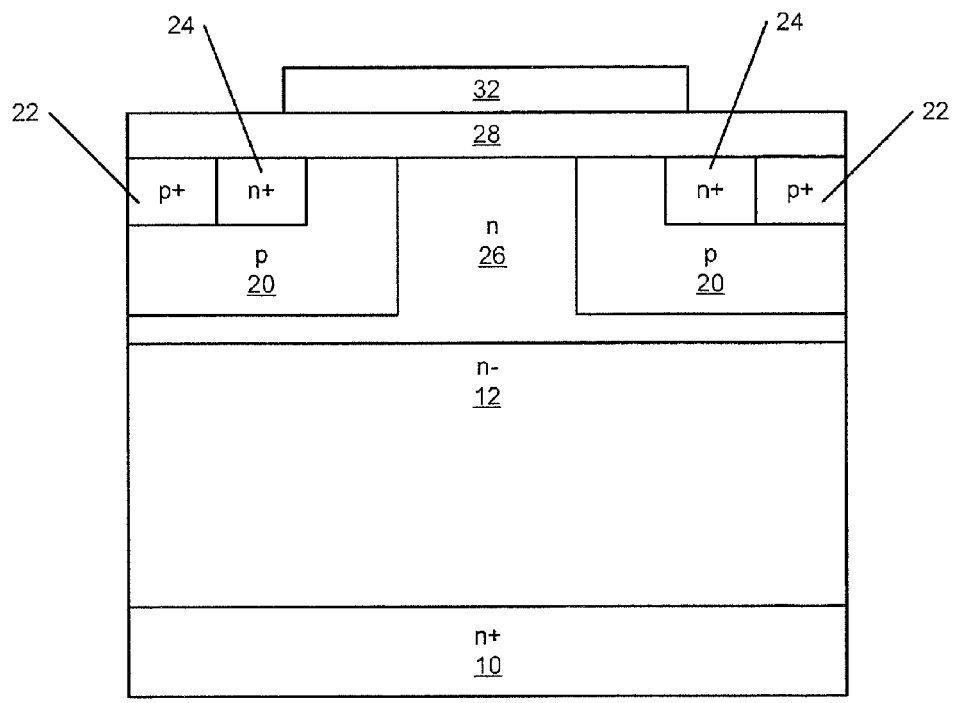
Figure 4H:
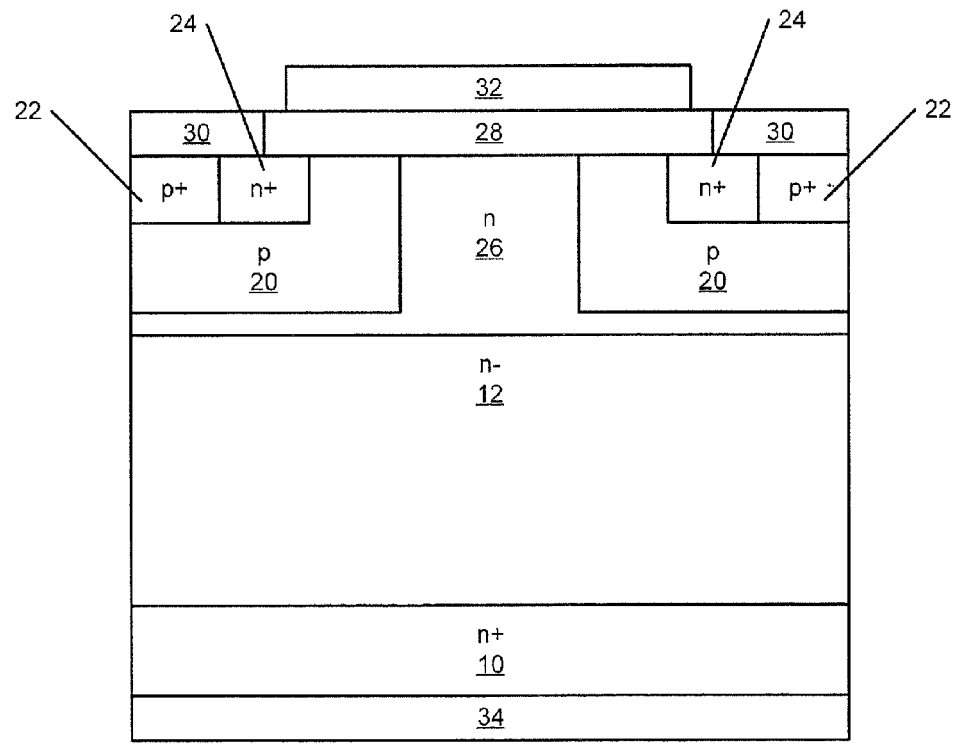

FIG. 4G illustrates formation of the gate contact 32. As described above, the gate contact 32 may be p-type polysilicon and/or may be other suitable contact material and may be formed and patterned utilizing techniques known to those of skill in the art. Alternatively, the oxide 28 of FIG. 4F and the gate contact 32 may be formed and patterned together. Finally, FIG. 4H illustrates formation of the source and drain contacts 30 and 34 respectively, that may be formed by evaporative deposition, sputtering or other such techniques known to those of skill in the art. In certain embodiments, the source and drain contacts 30 and 34 are nickel which is annealed at about 825° C. after formation so as to improve the quality of the ohmic contact.

Figure 5A:
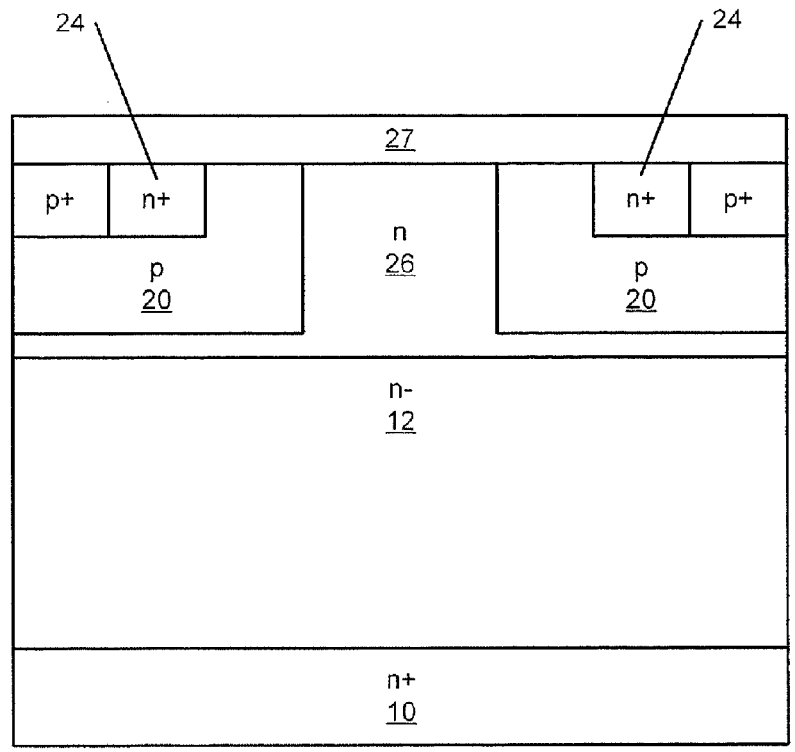
FIGS. 5A through 5D illustrate processing steps in the fabrication of MOSFETS according to further embodiments of the present invention.
Figure 5B:
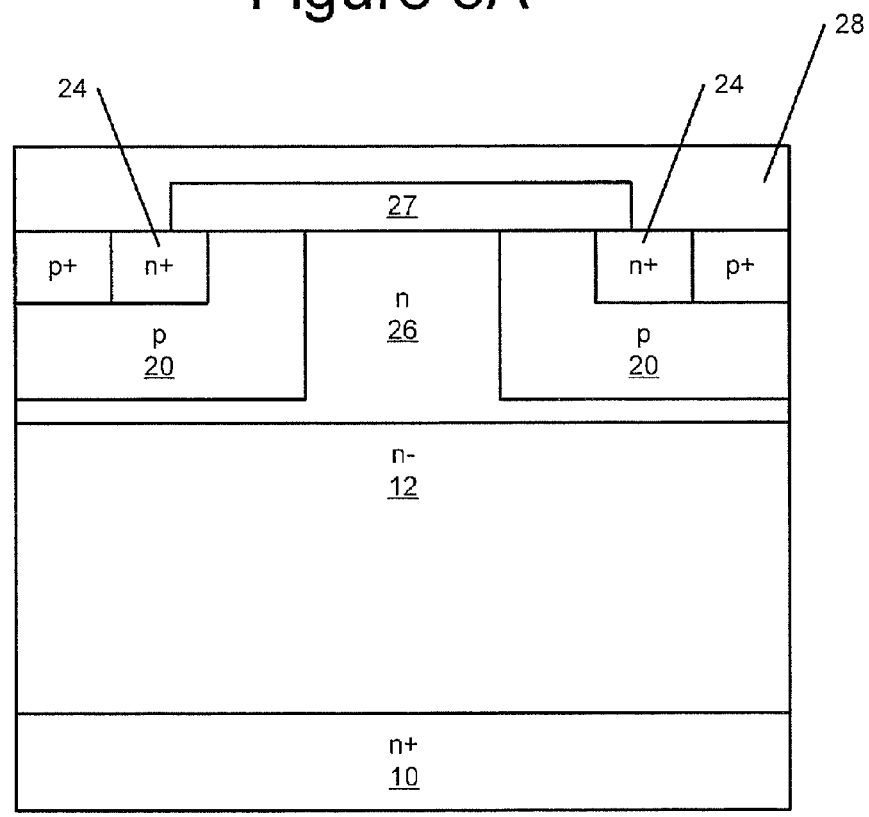

FIGS. 5A through 5D illustrate operations in the fabrication of devices according to alternative embodiments of the present invention utilizing a regrown epitaxial layer. Operations for fabrication of the devices are the same as those described above with reference to FIGS. 4A through 4E and continue with the operations illustrated in FIG. 5A. As seen in FIG. 5A, an n-type epitaxial layer 27 is formed on the structure of FIG. 4E. Such growth may be provided before or after annealing to activate the implants. The epitaxial layer 27 is patterned to extend between the implanted regions 24 as seen in FIG. 5B. FIG. 5B also illustrates the formation of the gate oxide 28. In some embodiments, the gate oxide 28 is thermally grown and may be a nitrided oxide. The nitrided oxide may be any suitable gate oxide, however, $SiO_2$, oxynitride or ONO may be preferred. Formation of the gate oxide may be carried out as described above with reference to FIG. 4F.

Figure 5C:
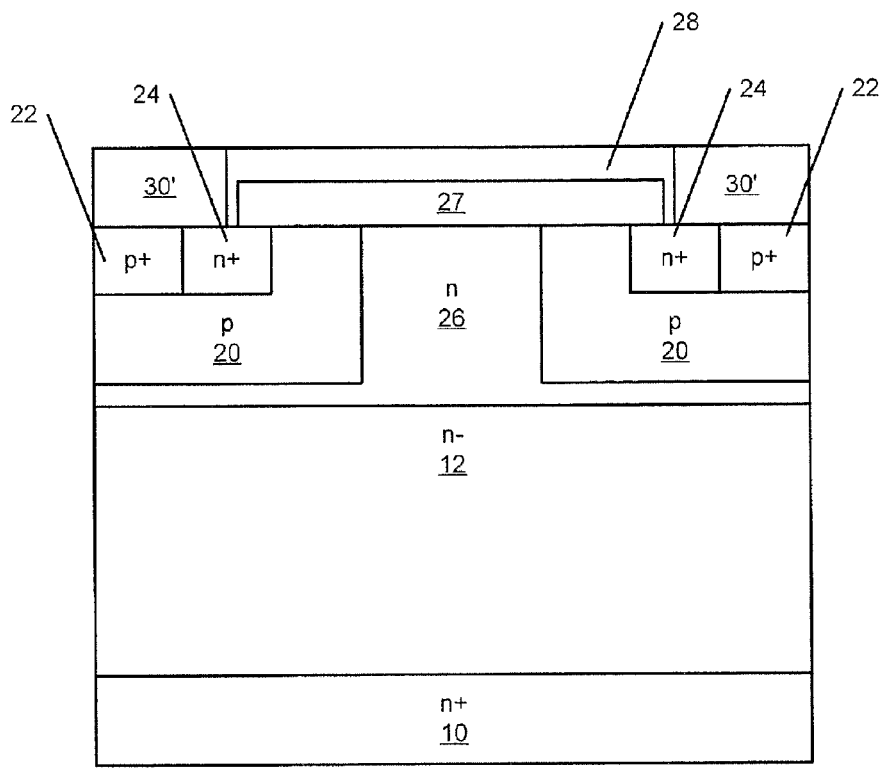
Figure 5D:
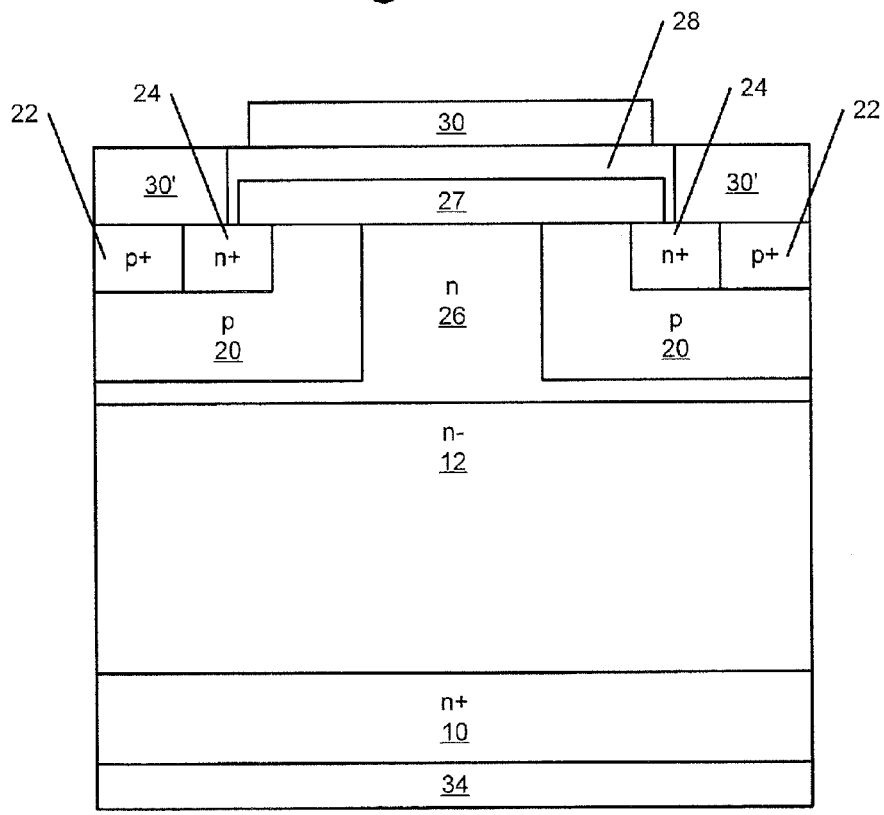

FIG. 5C illustrates formation of source contacts 30'. As seen in FIG. 5C, windows are opened in the gate oxide 28 corresponding to the location of the $p^+$ regions 22 and/or $n^+$ regions 24. The contacts 30' are then formed in the window. FIG. 5D illustrates formation of the gate contact 32 and the source contacts 30'. Alternatively, the oxide 28 of FIG. 5D and the gate contact 32 may be formed together. Thus, the gate contact may be formed and patterned prior to opening windows for the source contacts. As described above, the gate contact 32 may be p-type polysilicon or may be other suitable contact material and may be formed and patterned utilizing techniques known to those of skill in the art. Source contacts 30' may be formed by evaporative deposition, sputtering or other such techniques known to those of skill in the art. Finally, FIG. 5D also illustrates formation of the drain contact 34 which may be formed by evaporative deposition, sputtering or other such techniques known to those of skill in the art. In certain embodiments, the source and drain contacts 30' and 34 are nickel which is annealed at temperature of from about 600° C. to about 1000° C., for example, about 825° C., after formation so as to improve the quality of the ohmic contact.

In addition to the embodiments described herein, embodiments of the JFET limiting regions may also be provided in DMOSFETs as described in U.S. patent application Ser. No. 09/911,995 filed Jul. 24, 2001 and entitled "Silicon Carbide Power Metal-Oxide Semiconductor Field Effect Transistors Having a Shorting Channel and Methods of Fabricating Silicon Carbide Metal-Oxide Semiconductor Field Effect Transistors Having a Shorting Channel," the disclosure of which is incorporated herein as if set forth fully.

While embodiments of the present invention have been described with reference to particular sequences of operations, as will be appreciated by those of skill in the art, certain operations within the sequence may be reordered while still benefiting from the teachings of the present invention. For example, in particular embodiments of the present invention, the formation of the $n^+$ regions 24 and the $p^+$ regions 22 may be reversed. Accordingly, the present invention should not be construed as limited to the exact sequence of operations described herein.

Figure 6A:
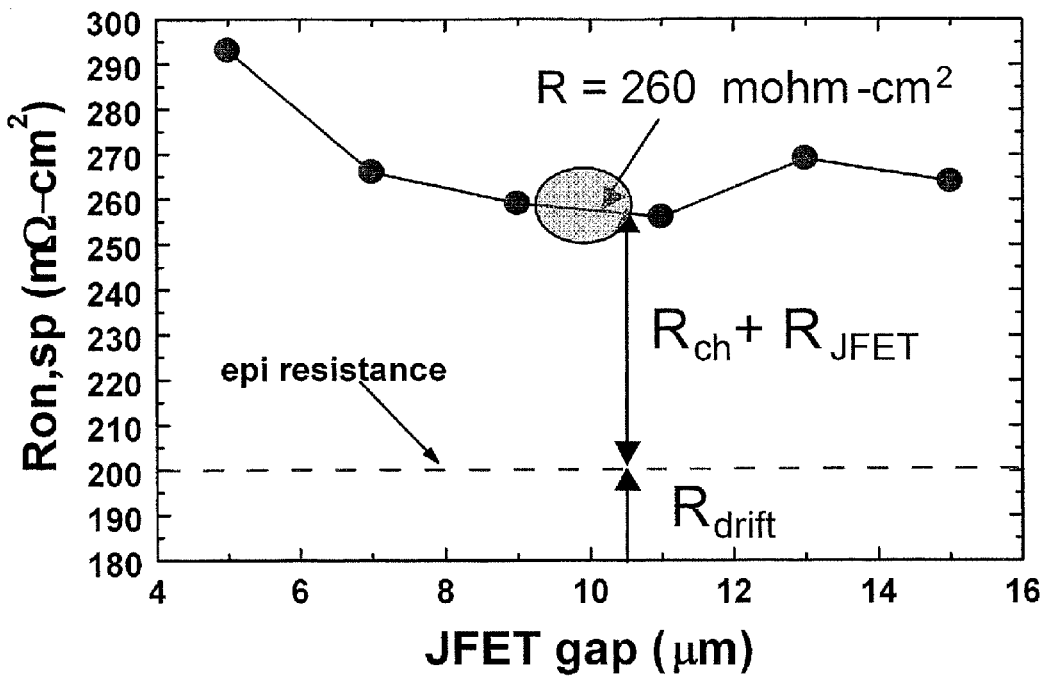
FIGS. 6A and 6B are simulation results for a conventional DIMOSFET illustrating on-state resistance and oxide field voltage versus gap between the p-well regions of the simulated device.
Figure 6B:
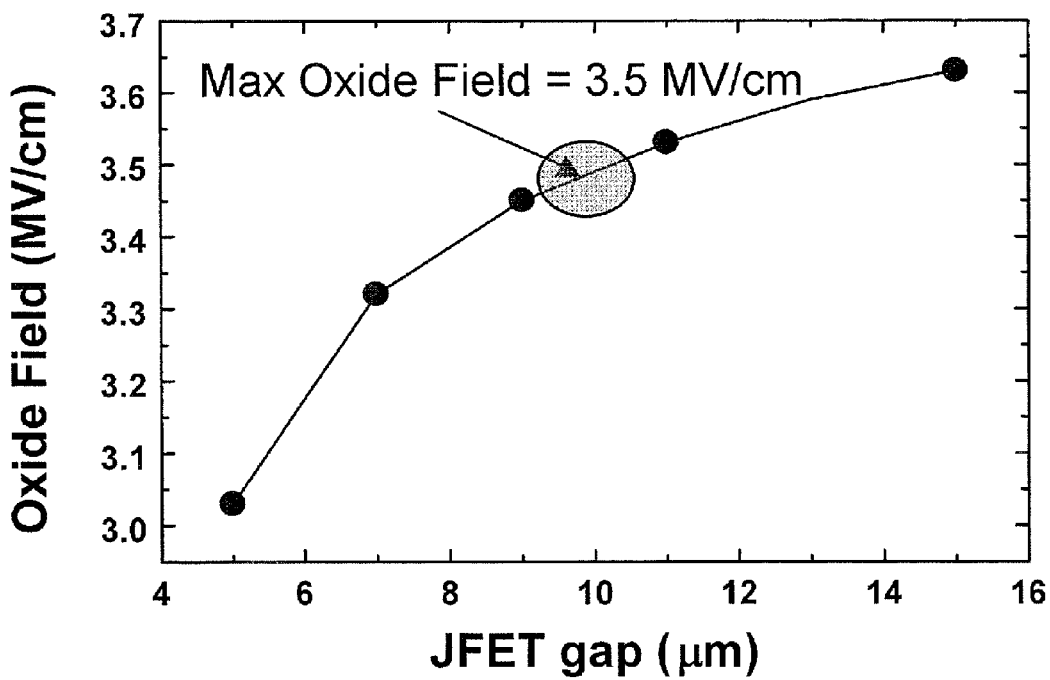
Figure 7A:
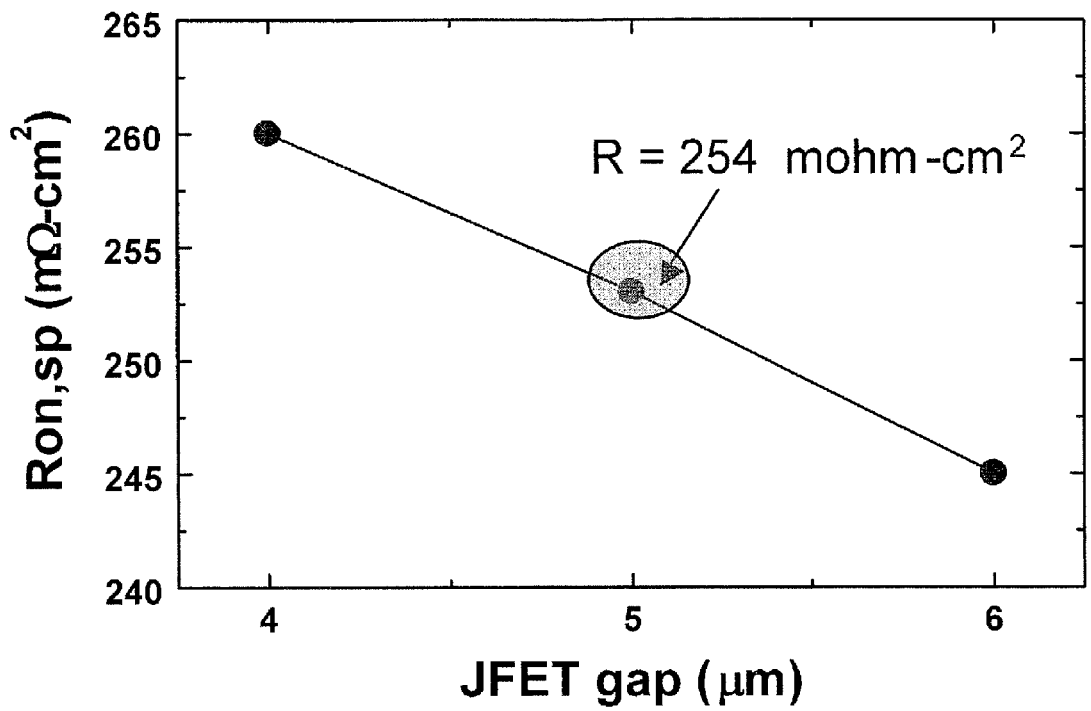
FIGS. 7A and 7B are simulation results for a DIMOSFET with a implanted spacer illustrating on-state resistance and oxide field voltage versus gap between the p-well regions of the simulated device.
Figure 7B:
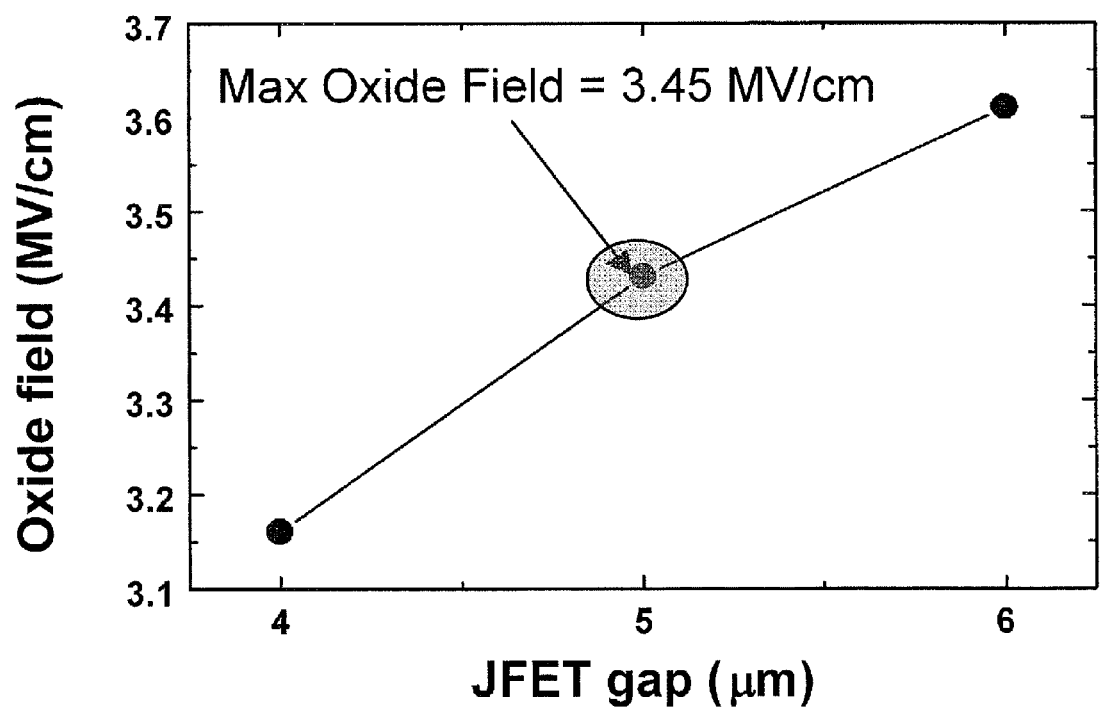
Figure 8A:
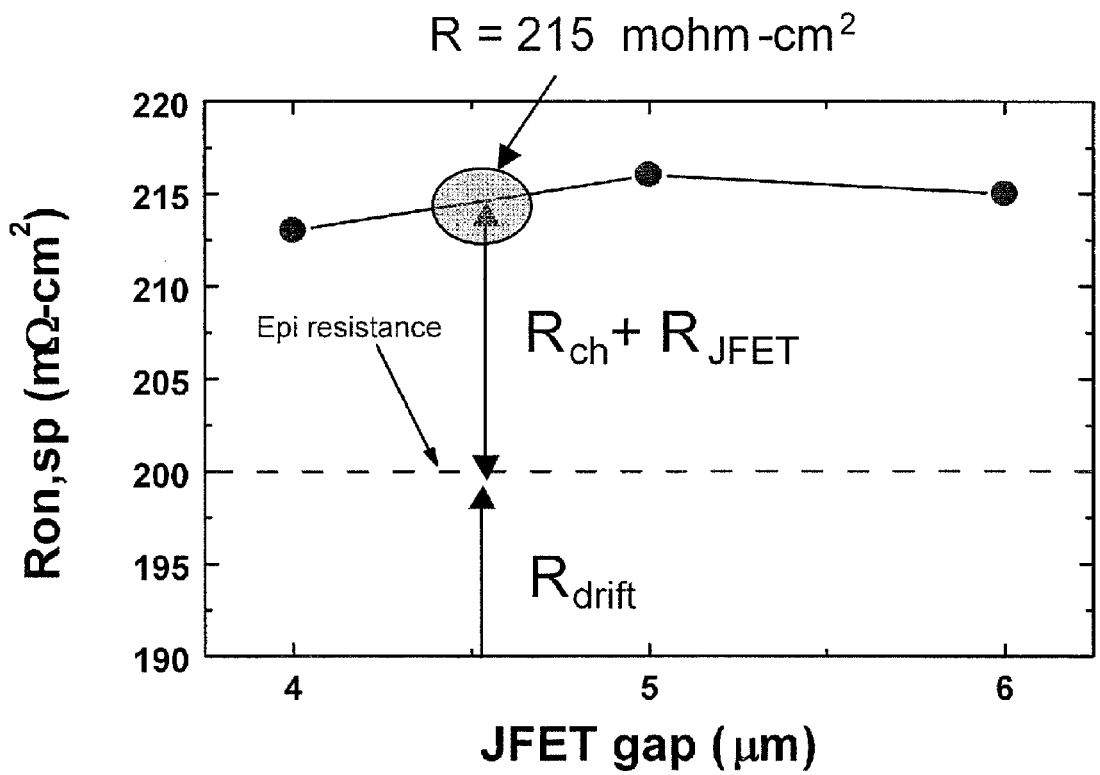
FIGS. 8A and 8B are simulation results for a DIMOSFET according to embodiments of the present invention illustrating on-state resistance and oxide field voltage versus gap between the p-well regions of the simulated device.
Figure 8B:
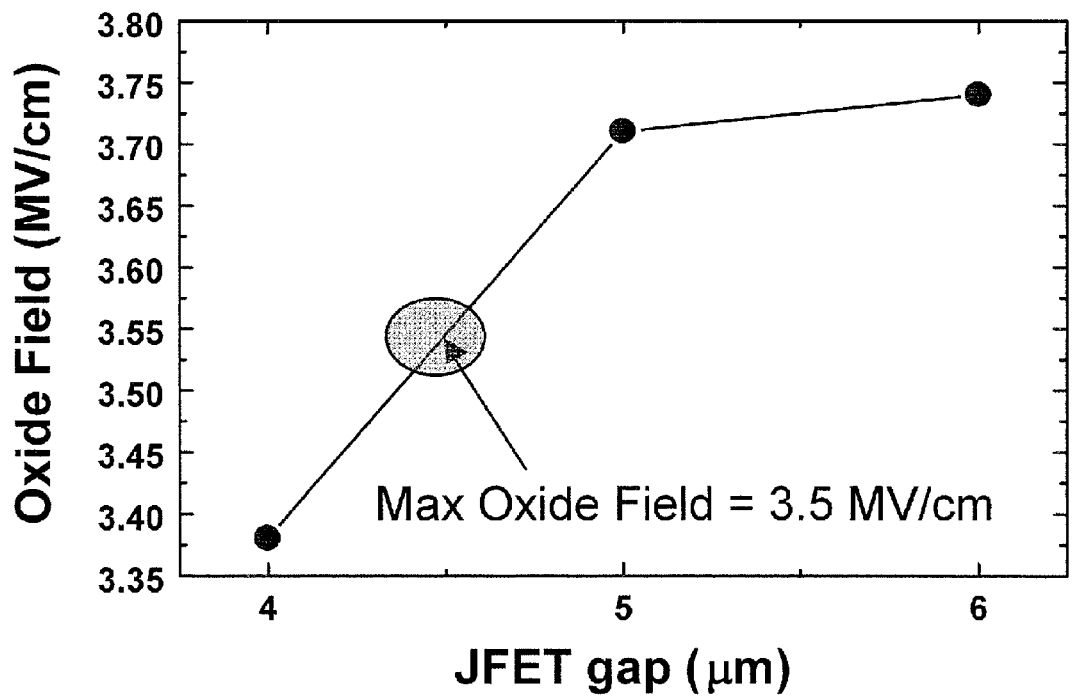

FIGS. 6A through 8B are 2D simulation results for various DMOSFET structures illustrating on-state resistance or oxide field strength versus JFET gap distance. FIGS. 6A and 6B are simulation results for a conventional DMOSFET having a $6\times10^{14}$ cm$^{-3}$ and 115 μm thick drift layer and 10 μm wide p-wells that extend 0.75 μm into the drift layer. FIGS. 7A and 7B are simulation results for a DMOSFET having a $6\times10^{14}$ cm$^{-3}$ and 115 μm thick drift layer, 10 μm wide p-wells that extend 0.75 μm into the drift layer and a $5\times10^{15}$ cm$^{-3}$ spacer implant that extends 0.75 μm into the drift layer. FIGS. 8A and 8B are simulation results for a DMOSFET according to embodiments of the present invention having a $6\times10^{14}$ cm$^{-3}$ and 115 μm thick drift layer, 10 μm wide p-wells that extend 0.75 μm into a $5\times10^{15}$ cm$^{-3}$ epitaxial layer that is 1.75 μm thick. As seen in FIGS. 6A through 8B, embodiments of the present invention may provide narrower JFET gaps for a given maximum oxide field as well as reduced on state resistance.

Figure 9A:
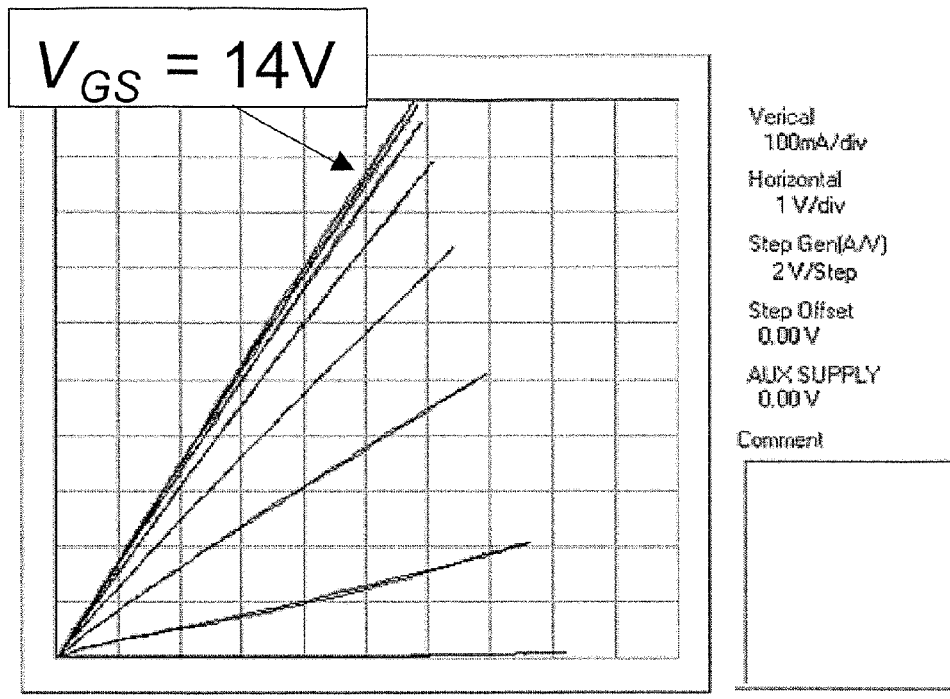
FIGS. 9A and 9B are experimentally obtained I-V curves for a DIMOSFET with a implanted spacer (FIG. 9A) and a DIMOSFET according to embodiments of the present invention (FIG. 9B)
Figure 9B:
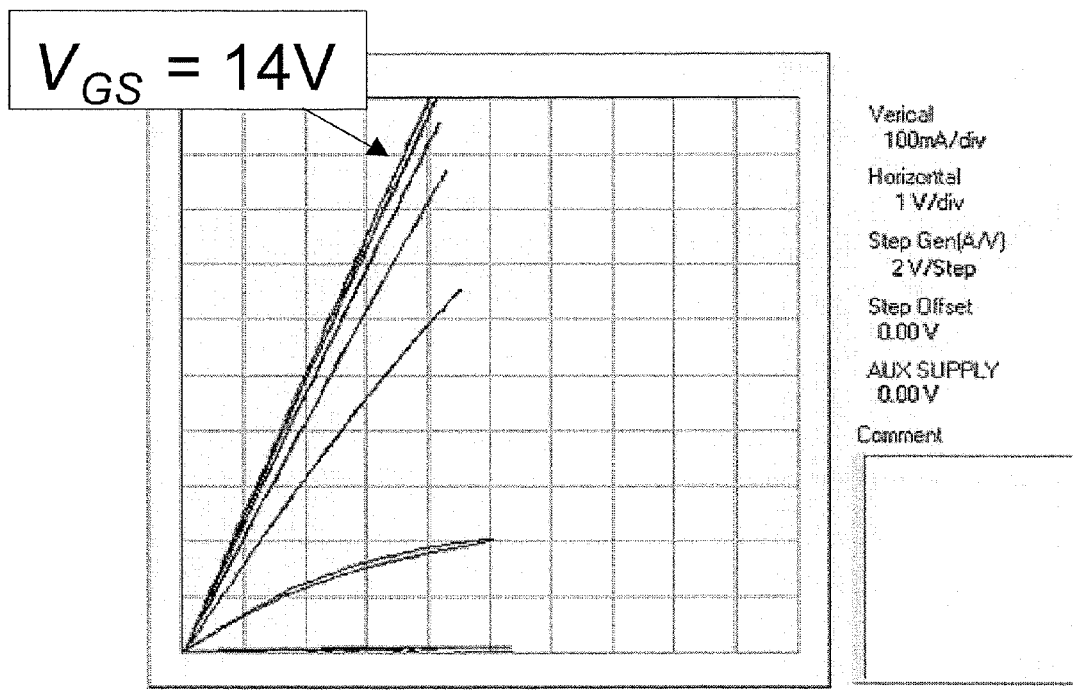
Figure 10A:
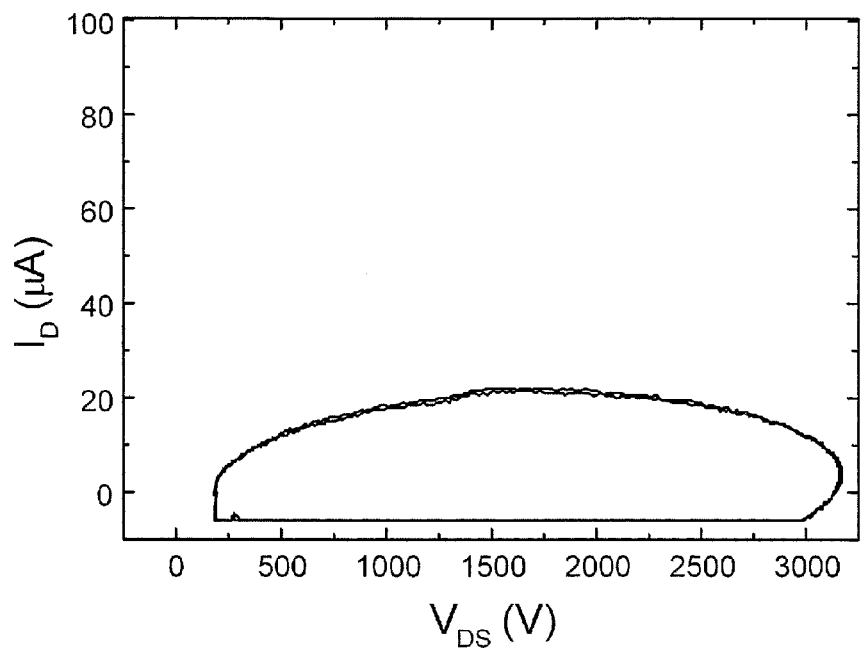
FIGS. 10A and 10B are experimentally obtained reverse bias leakage current plots for a DIMOSFET with a implanted spacer (FIG. 10A) and a DIMOSFET according to embodiments of the present invention (FIG. 10B).
Figure 10B:
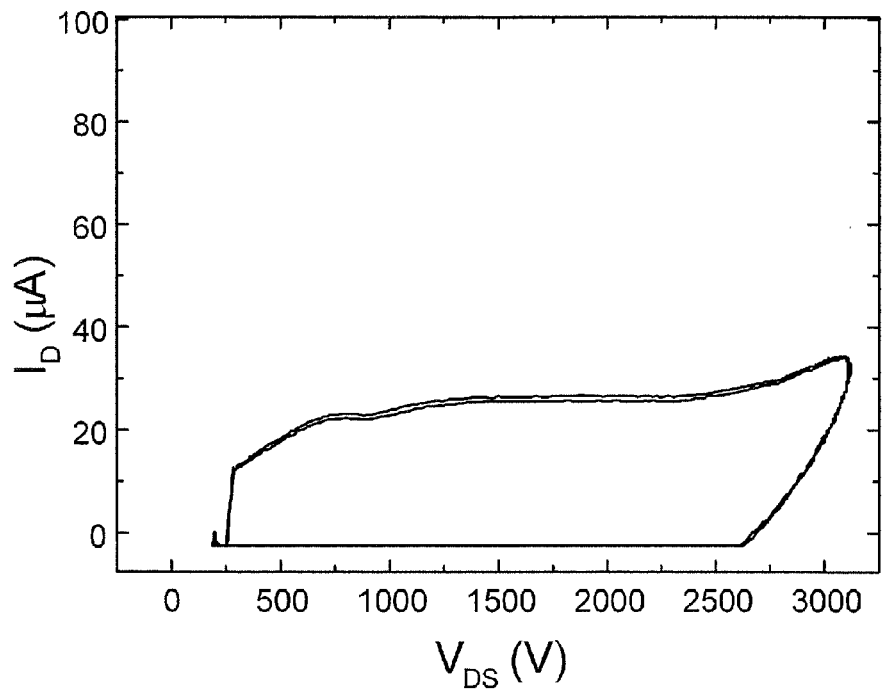

FIG. 9A is a measured I-V curve for a DMOSFET without the JFET limiting region according to embodiments of the present invention and FIG. 9B is a measured I-V curve for a DMOSFET with JFET limiting regions according to embodiments of the present invention. As seen in FIGS. 9A and 9B, the measured on-state resistance is reduced from 266 mΩ-cm$^2$ to 189 mΩ-cm$^2$. Furthermore, FIG. 10A is a measured drain leakage current trace for a DMOSFET without the JFET limiting region according to embodiments of the present invention and FIG. 10B is a measured drain leakage trace for a DMOSFET with JFET limiting regions according to embodiments of the present invention. As seen in FIGS. 10A and 10B, both devices had a breakdown voltage of greater than 3150 V.

In the drawings and specification, there have been disclosed typical preferred embodiments of the invention and, although specific terms are employed, they are used in a generic and descriptive sense only and not for purposes of limitation.

That which is claimed:

1. A method of fabricating a silicon carbide metal-oxide semiconductor field effect transistor unit cell comprising:
    providing an n-type silicon carbide drift layer;
    providing a first p-type silicon carbide region adjacent the drift layer;
    providing a first n-type silicon carbide region within the first p-type silicon carbide region;
    providing an oxide layer adjacent the drift layer; and
    providing an n-type silicon carbide limiting region between the drift layer and a portion of the first p-type silicon carbide region, wherein the n-type limiting region comprises a first portion laterally extending along a floor of the first p-type silicon carbide region and a second portion disposed adjacent to a sidewall of the first p-type silicon carbide region,
    wherein the n-type limiting region has a carrier concentration that is greater than a carrier concentration of the drift layer, and wherein the first portion has a carrier concentration greater than a carrier concentration of the second portion.

2. A method according to claim 1, wherein providing a first p-type silicon carbide region further comprises:
    implanting aluminum in the p-type silicon carbide region; and
    annealing the p-type silicon carbide region at a temperature of at least 1500° C.

3. A method according to claim 1, further comprising:
    providing a gate contact on the oxide layer;
    providing a source contact on the first n-type silicon carbide region; and
    providing a drain contact on the drift layer opposite the oxide layer.

4. A method according to claim 1, wherein providing an n-type limiting region comprises:
    providing an n-type epitaxial layer of silicon carbide on the n-type silicon carbide drift layer;
    providing a mask on the epitaxial layer;
    patterning the epitaxial layer to form the n-type limiting region.

5. A method according to claim 1, wherein providing an n-type limiting region comprises implanting n-type regions in the drift layer.

6. A method according to claim 1, wherein the n-type limiting region is formed to a thickness of from about 0.5 μm to about 1.5 μm and a carrier concentration of from about $1\times10^{15}$ to about $5\times10^{17}$ cm$^{-3}$.

7. A method according to claim 1, further comprising providing an n-type epitaxial layer on the first p-type region and a portion of the first n-type region, and between the first n-type region and the first p-type region and the oxide layer.

8. A method according to claim 1, further comprising providing a second p-type silicon carbide region within the first p-type silicon carbide region and adjacent the first n-type silicon carbide region.

9. A method according to claim 3, wherein the gate contact comprises polysilicon or metal.

10. A method according to claim 3, further comprising providing an n-type silicon carbide substrate between the drift layer and the drain contact.

11. A method according to claim 4, wherein providing a first p-type region comprises providing the first p-type region in but not through the epitaxial layer of silicon carbide.

12. The method of claim 1, wherein the first portion of the n-type limiting region is confined beneath the first p-type silicon carbide region.

13. A method of fabricating a silicon carbide metal-oxide semiconductor field effect transistor, comprising the steps of:
providing a drift layer of n-type silicon carbide;
providing first regions of p-type silicon carbide adjacent the drift layer;
providing a first region of n-type silicon carbide between peripheral edges of the first regions of p-type silicon carbide;
providing second regions of n-type silicon carbide in the first regions of p-type silicon carbide, wherein the second regions of n-type silicon carbide have a carrier concentration greater than a carrier concentration of the drift layer and are spaced apart from the peripheral edges of the first regions of p-type silicon carbide;
providing an oxide layer on the drift layer, the first region of n-type silicon carbide and the second regions of n-type silicon carbide; and
providing third regions of n-type silicon carbide laterally extending along respective floors of the first regions of p-type silicon carbide and between the first regions of p-type silicon carbide and the drift layer, wherein the first and third regions of n-type silicon carbide define an n-type limiting region having a carrier concentration greater than the carrier concentration of the drift layer, wherein the first region of n-type silicon carbide has a higher carrier concentration than a carrier concentration of the drift layer and has a lower carrier concentration than the carrier concentration of the third regions of n-type silicon carbide;
providing source contacts on portions of the second regions of n-type silicon carbide;
providing a gate contact on the oxide layer; and
providing a drain contact on the drift layer opposite the oxide layer.

14. A method according to claim 13, wherein providing third regions of n-type silicon carbide further comprises providing the third regions of n-type silicon carbide adjacent the peripheral edges of the first regions of p-type silicon carbide.

15. A method according to claim 13, further comprising providing an n-type silicon carbide epitaxial layer on the drift layer, wherein the first region of n-type silicon carbide and the third regions of n-type silicon carbide are formed from the epitaxial layer, and wherein the first regions of p-type silicon carbide are formed in the epitaxial layer.

16. A method according to Claim 13, wherein providing third regions of n-type silicon carbide comprises providing the third regions of n-type silicon carbide by implanting n-type regions in the drift layer.

17. A method according to claim 13, further comprising providing an n-type epitaxial layer of silicon carbide on the first p-type regions and the first region of n-type silicon carbide.

18. A method according to claim 13, further comprising providing an n-type silicon carbide layer between the drift layer and the drain contact, wherein the n-type silicon carbide layer has a higher carrier concentration than the carrier concentration of the drift layer.

19. A method according to claim 13, further comprising providing second p-type silicon carbide regions within the first p-type silicon carbide regions.

20. A method according to claim 13, wherein the third regions of n-type silicon carbide have a thickness of from about 0.5 µm to about 1.5 µm.

21. A method according to claim 13, wherein the third regions of n-type silicon carbide have a carrier concentration of from about $1 \times 10^{15}$ to about $5 \times 10^{17}$ cm$^{-3}$.

22. The method of claim 13, wherein the third regions of n-type silicon carbide are confined beneath the first regions of p-type silicon carbide.

23. A method according to claim 18, wherein the n-type silicon carbide layer comprises an n-type silicon carbide substrate.

24. A method of fabricating a silicon carbide metal-oxide semiconductor field effect transistor comprising:
providing an n-type silicon carbide drift layer;
providing spaced apart p-type silicon carbide well regions; and
providing an n-type silicon carbide limiting region between the well regions and the drift layer, wherein the n-type limiting region comprises a first portion laterally extending along respective floors of the well regions and a second portion adjacent to respective sidewalls of the well regions,
wherein the n-type limiting region has a carrier concentration higher than a carrier concentration of the drift layer, and wherein the first portion has a carrier concentration higher than a carrier concentration of the second portion.

25. A method according to claim 24, wherein providing an n-type limiting region comprises providing an epitaxial layer of silicon carbide on the drift layer, and wherein providing spaced apart p-type well regions comprises providing spaced apart p-type well regions in but not through the epitaxial layer.

26. The method of claim 24, wherein the first portion of the n-type limiting region is confined beneath the well regions.

* * * * *